US011019712B2

(12) United States Patent
Chesny et al.

(10) Patent No.: US 11,019,712 B2
(45) Date of Patent: May 25, 2021

(54) METHOD AND APPARATUS FOR TORSIONAL MAGNETIC RECONNECTION

(71) Applicant: SunBeam Technologies, LLC, Moncks Corner, SC (US)

(72) Inventors: David Lawrence Chesny, Melbourne, FL (US); Norton Brice Orange, Moncks Corner, SC (US)

(73) Assignee: SunBeam Technologies, LLC, Moncks Corner, SC (US)

( * ) Notice: Subject to any disclaimer, the term of this patent is extended or adjusted under 35 U.S.C. 154(b) by 0 days.

(21) Appl. No.: 16/647,971

(22) PCT Filed: Nov. 27, 2018

(86) PCT No.: PCT/US2018/062511
§ 371 (c)(1),
(2) Date: Mar. 17, 2020

(87) PCT Pub. No.: WO2019/212595
PCT Pub. Date: Nov. 7, 2019

(65) Prior Publication Data
US 2020/0221563 A1    Jul. 9, 2020

Related U.S. Application Data

(60) Provisional application No. 62/664,968, filed on May 1, 2018, provisional application No. 62/696,909, filed on Jul. 12, 2018.

(51) Int. Cl.
*H05H 1/16* (2006.01)
*H05H 1/24* (2006.01)

(52) U.S. Cl.
CPC ............. *H05H 1/16* (2013.01); *H05H 1/24* (2013.01)

(58) Field of Classification Search
None
See application file for complete search history.

(56) References Cited

U.S. PATENT DOCUMENTS 3,989,922 A * 11/1976 Fahey .................... B23K 9/091
                                                      219/130.51
4,363,776 A * 12/1982 Yamada ................... H05H 1/12
                                                           376/137
(Continued)

FOREIGN PATENT DOCUMENTS

WO    WO-2019212595 A1 * 11/2019 ............... H05H 1/16

OTHER PUBLICATIONS

Bathgate et al, "A thruster using magnetic reconnection to create a high-speed plasma jet" Eur. Phys. J. Appl. Phys. 84, 20801 (2018) (19 pages).
(Continued)

*Primary Examiner* — Amy Cohen Johnson
*Assistant Examiner* — Srinivas Sathiraju
(74) *Attorney, Agent, or Firm* — Thrive IP®; Jeremy M. Stipkala; William La Salle, III

(57) ABSTRACT

A method and apparatus for forming torsional magnetic reconnection, and converting stored magnetic energy into charged particle kinetic energy and particle acceleration, is claimed. A torsional magnetic reconnection apparatus generally comprises (1) a vacuum environment housing (2) a plurality of conducting coils to form a magnetic field fan-spine topology and (3) a plasma generation device providing an azimuthal magnetic field perturbation such that current sheets are formed and magnetic reconnection processes can occur. Electric current energization of the plurality of conducting coils generates a potential magnetic fan-spine topology. A simultaneous capacitor bank discharge forms and axially drives a plasma sheath, featuring an azimuthal magnetic field, toward the fan-spine magnetic null that forces the (Continued)

diffusion of magnetic flux through the plasma. This magnetic to plasma kinetic energy conversion process accelerates charged particles far away from the reconnection region along open magnetic field lines.

21 Claims, 30 Drawing Sheets

(56) References Cited

U.S. PATENT DOCUMENTS

| | | | | | |
|---|---|---|---|---|---|
| 4,687,899 | A | * | 8/1987 | Acheson | B23K 9/048 219/125.11 |
| 4,952,769 | A | * | 8/1990 | Acheson | B23K 9/048 219/125.11 |
| 4,990,732 | A | * | 2/1991 | Dudko | B23K 20/06 219/617 |
| 5,587,093 | A | * | 12/1996 | Aston | H05H 1/48 219/121.36 |
| 5,624,592 | A | * | 4/1997 | Paustian | H05B 6/80 219/679 |
| 5,734,143 | A | * | 3/1998 | Kawase | H01J 37/32229 219/121.43 |
| 5,866,871 | A | * | 2/1999 | Birx | H01J 27/04 219/121.48 |
| 5,923,716 | A | * | 7/1999 | Meacham | G21B 1/00 376/121 |
| 6,111,237 | A | * | 8/2000 | Paustian | H02G 13/20 219/687 |
| 6,396,213 | B1 | * | 5/2002 | Koloc | H05H 1/52 315/111.21 |
| 6,826,222 | B2 | * | 11/2004 | Hill | H01S 3/2215 315/111.21 |
| 6,921,042 | B1 | * | 7/2005 | Goodzeit | H02K 55/00 242/430 |
| 7,215,697 | B2 | * | 5/2007 | Hill | H01S 3/036 372/76 |
| 7,679,025 | B1 | * | 3/2010 | Krishnan | H05G 2/003 219/121.48 |
| 8,287,453 | B2 | * | 10/2012 | Li | A61B 5/14865 600/365 |
| 9,460,884 | B2 | * | 10/2016 | Hopwood | H05H 1/2406 |
| 9,824,845 | B2 | * | 11/2017 | Cheatham | H01J 29/02 |
| 10,254,499 | B1 | * | 4/2019 | Cohen | B23K 1/19 |
| 10,562,226 | B1 | * | 2/2020 | Cohen | B29C 70/382 |
| 10,571,642 | B1 | * | 2/2020 | Cohen | G02B 6/25 |
| 2004/0210289 | A1 | * | 10/2004 | Wang | B82Y 25/00 607/116 |
| 2004/0249428 | A1 | * | 12/2004 | Wang | A61L 29/10 607/116 |
| 2006/0041270 | A1 | * | 2/2006 | Lenker | A61B 17/3439 606/198 |
| 2010/0286791 | A1 | * | 11/2010 | Goldsmith | A61B 17/0057 623/23.7 |
| 2014/0163664 | A1 | * | 6/2014 | Goldsmith | A61B 17/12181 623/1.11 |
| 2014/0191591 | A1 | * | 7/2014 | Kasztenny | H01H 47/00 307/141 |
| 2019/0247050 | A1 | * | 8/2019 | Goldsmith | A61B 17/00491 |
| 2020/0221563 | A1 | * | 7/2020 | Chesny | H05H 1/16 |

OTHER PUBLICATIONS

Chesny, David L. "Non-Potential Magnetic Fields and Magnetic Reconnection in Low Collisional Plasmas—Discovery of Solar EUV Mini-Sigmoids and Development of Novel In-Space Propulsion Systems." PhD diss., Florida Institute of Technology, 2013 (234 pages).
Cargill, P. "From flares to nanoflares: Magnetic reconnection on the sun," Astronomy & Geophysics, vol. 54 (Jun. 2013) (5 pages).
Ilin, A. et al., "VASIMR Human Mission to Mars," Space, Propulsion and Energy Sciences International Forum (Mar. 2011). (12 pages).
Craig, I.J.D. et al., "An Exact Solution for Steady State Magnetic Reconnection in Three Dimensions," The Astrophys. J. 455:L197-L199 (Dec. 20, 1995). (4 pages).
Cazzola et al. "On the ions acceleration via collisionless magnetic reconnection in laboratory plasmas" Physics of Plasmas 23, 112108 (2016); doi: 10.1063/1.4967704 (16 pages).
Cazzola et al. "On magnetic reconnection as promising driver for future plasma propulsion systems" Physics of Plasmas 25, 073512 arXiv:1807.11441v1 (2018) (34 pages).
Dalla, S. & Browning, P.K. "Jets of Energetic Particles Generated by Magnetic Reconnection at a Three-Dimensional Magnetic Null" The Astrophysical Journal, 640:L99-L102, (2006) (4 pages).
Dalla, S. & Browning, P.K. "Particle acceleration at a three-dimensional reconnection site in the solar corona" A&A 436, 1103-1111 (2005) (9 pages).
Dalla, S. & Browning, P.K. "Particle trajectories and acceleration during 3D fan reconnection" A&A 491, 289-295 (2008) (7 pages).
Egedal et al. Collisionless magnetic reconnection in a toroidal cusp* Phys. Plasmas, vol. 8, No. 5, May 2001 (9 pages).
Egedal et al. "Plasma generation and confinement in a toroidal magnetic cusp" Rev. Sci. Instrum., vol. 71, No. 9, Sep. 2000 (11 pages).
Gascoyne, A.D. "Dynamics of charged particle motion in the vicinity of three dimensional magnetic null points: Energization and chaos." Physics of Plasmas, 22 (3) (2015) (13 pages).
Hosseinpour, M. "Accelerated jets of energetic protons generated by torsional fan reconnection" Astrophys Space Sci (2015) (8 pages).
Hosseinpour et al. "Comparison of test particle acceleration in torsional spine and fan reconnection regimes" Phys. Plasmas 21, 102904 (2014) (12 pages).
Hosseinpour, M. "Test particle acceleration in torsional fan reconnection" MNRAS 445, 2476-2483 (2014) (8 pages).
Hosseinpour, M. "Test particle acceleration in torsional spine magnetic reconnection" Astrophys Space Sci (2014) (9 pages).
Larson, A. et al. "Experimental and Evaluation Studies of a Coaxial Plasma Gun Accelerator" Technical Report NASA-CR-54710 GD/C-DBE-65-026, 19670001436 (121 pages).
Liu et al. "Chromospheric Jet and Growing "Loop" Observed by Hinode: New Evidence of Fan-Spinemagnetic Topology Resulting From Flux Emergence" The Astrophysical Journal, 728:103 (2011) (16 pages).
Mason et al. "Observations of Solar Coronal Rain in Null Point Topologies" The Astrophysical Journal Letters, 874:L33 )2019) (10 pages).
Masson et al. "Interchange Slip-Running Reconnection and Sweeping SEP Beams" Solar Physics (2011) (24 pages).
Pariat et al. "Three-Dimensional Modeling of Quasi-Homologous Solar Jets" The Astrophysical Journal, 714:1762-1778, (2010) (17 pages).
Parnell et al., "Structure and Collapse of Three-Dimensional Magnetic Neutral Points" Geophysical and Astrophysical Fluid Dynamics (1997) (26 pages).
Parnell et al., "The structure of three-dimensional magnetic neutral points" Physics of Plasmas (1996) (12 pages).
Pontin et al., "On the Nature of Reconnection at a Solar Coronal Null Point Above a Separatrix Dome" The Astrophysical Journal, 774:154 (2013) (10 pages).
Pontin D. & Galsgaard K, "Current amplification and magnetic reconnection at a three-dimensional null point: Physical characteristics" Journal of Geophysical Research, vol. 112, A03103 (2007) (14 pages).
Pontin et al., "Generalised models for torsional spine and fan magnetic reconnection" A&A 533, A78 (2011) (11 pages).
Schaer, S.F. "Coaxial Plasma Gun in the High Density Regime and Injection Into a Helical Field" Helvetica Physica Acta 67 (1995) (23 pages).
Scheurer et al. "Performance of a Quasi-steady, Multi Megawatt, Coaxial Plasma Thruster." NASA Technical Report NASA-CR-195311 (1994) (88 pages).
Stanier et al. "Solar Particle Acceleration at Reconnecting 3D Null Points." Astronomy & Astrophysics A47 (2012) (14 pages).

(56) References Cited

OTHER PUBLICATIONS

Stenzel et al. "A New Laboratory Experiment on Magnetic Reconnection." Physics of Plasmas vol. 9 (2002) (6 pages).
Stenzel et al. "3D EMHD Reconnection in a Laboratory Plasma." Earth, Planets, and Space vol. 53 (2001) (8 pages).
Thio et al. "An Experimental Study of a Pulsed Electromagnetic Plasma Accelerator." AAIA-2002-4269 (2002) (13 pages).
Thurgood et al. "Three-Dimensional Oscillatory Magnetic Reconnection." Astrophysics J. 8442 (2017) (12 pages).
Witherspoon et al. "A Contoured Gap Coaxial Plasma Gun With Injected Plasma Armature." Review of Scientific Instruments vol. 80 (2009) (15 pages).
Wyper, P. & Jain, R. "Torsional Magnetic Reconnection at Three Dimensional Null Points: A Phenomenological Study." Physics of Plasmas vol. 17 (2010) (12 pages).
Yamada et al. "Study of Driven Magnetic Reconnection in a Laboratory Plasma." Physics of Plasmas vol. 4 (1997) (10 pages).
Yamada et al. "Identification of Y-Shaped and O-Shaped Diffusion Regions During Magnetic Reconnection in Laboratory Plasma." Phys. Rev. Lett vol. 78 (1997).
Brown et al. "Two Fluid Effects on Three-Dimensional Reconnection in the Swarthmore Spheromak Experiment With Comparisons to Space Data." Physics of Plasmas vol. 13 (2006).
International Search Report for PCT/US18/62511 (dated Feb. 6 2019) (2 pages).
Written Opinion for PCT/US18/62511 (dated Feb. 6, 2019) (4 pages).
Chesny et al. "Toward laboratory torsional spine magnetic reconnection." J. Plasma Physics, vol. 83, issue 6, article id 905830602 (Dec. 2017) (19 pages).

\* cited by examiner

METHOD AND APPARATUS FOR TORSIONAL MAGNETIC RECONNECTION

CROSS REFERENCE TO RELATED APPLICATIONS

This application represents the National Phase under 35 U.S.C. § 371 of international application No. PCT/US2018/062511, entitled, "METHOD AND APPARATUS FOR TORSIONAL MAGNETIC RECONNECTION," and filed internationally on Nov. 27, 2018, which International Application claims benefit of priority under PCT Article 8 and 35 U.S.C. § 119(e) of U.S. Provisional Patent Application No. 62/664,968, filed on May 1, 2018, entitled "METHOD AND APPARATUS FOR TORSIONAL MAGNETIC RECONNECTION;" and U.S. Provisional Patent Application No. 62/696,909, filed on Jul. 12, 2018, entitled, "METHOD AND APPARATUS FOR TORSIONAL MAGNETIC RECONNECTION." The foregoing PCT/US2018/062511, 62/664,968, and 62/696,909 applications are incorporated herein by reference in their entireties.

FIELD OF THE INVENTION

The invention relates generally to the field of plasma physics, and, in particular, to methods and apparatuses for confining plasma to enable torsional magnetic reconnection, a process that converts stored magnetic energy into charged particle kinetic energy.

BACKGROUND OF THE INVENTION

In the art of laboratory plasma physics, investigations of magnetic reconnection are fundamental to the understanding of the storage and conversion of magnetic energy into plasma kinetic energy and particle acceleration. The process of magnetic reconnection in a laboratory relies on the localized formation and acceleration of charged particle current sheets that dissipate large amounts of stored magnetic energy. At the most basic level, laboratory reconnection experiments can be described by a two-step process. First, the system is set up with plasma in a static, or potential, magnetic field that approaches or satisfies ideal magnetohydrodynamics (MHD) and the frozen-in-flux condition where the plasma pressure is dominated by the magnetic field pressure. The magnitude of the magnetic field in the region where reconnection occurs is much less than the surrounding environment, such that its topology forms a null that is devoid of magnetic energy. Second, an externally driven instability is introduced that drives a bulk plasma flow, allowing current sheets to form in the vicinity of the null, thus forcing the break down of the frozen-in flux condition and allowing magnetic field line diffusion (slippages) through the plasma—the process of magnetic reconnection. Particles that travel in the vicinity of these null regions become relatively demagnetized, a characterization of the particle as having a large magnetic moment. The resulting energy transfer between the magnetic field line slippages and the charged particle current sheets acts to generate an electric field that accelerates charged particles in the vicinity of both the instability and the null.

Numerous laboratory experiments have been undertaken that attempt to reproduce the observed topological signatures seen in these dynamic plasma environments. In terms of existing laboratory experiments, tokamak and spheromak configurations use such sequential processes to study a wide range of magnetic reconnection and plasma turbulence schemes and are used to verify classical two-dimensional reconnection theoretical models. Most of these spheromak and tokamak-style experiments have been designed for and primarily focused on inducing quasi-axisymmetric "X-line" reconnecting plasma current sheets featuring "double-Y" 71 or "O" shaped diffusion region. See FIG. 2. However, 3D magnetic nulls that are more common in astrophysical plasmas follow the fan-spine topology of FIG. 3 where radially pointing magnetic field lines 27 in a 2D fan plane 30, converge at, but do not cross, a null 28 and recede in a collimated fashion away from the null along the anti-parallel spine axis 29 which is normal to the fan plane 30. See also FIG. 10. The magnetic field direction can be either in along the fan plane 30 and out along the spine axis 29, or in along the spine axis 29 and out along the fan plane 30.

In the laboratory setup of Electron Magnetohydrodynamics (EMHD), three-dimensional magnetic nulls were formed in pairs and connected by separator lines in an attempt to study a 3D fan-spine magnetic null point topology. EMHD nulls arise from a unique initial potential magnetic field within an ambient argon plasma, and plasma and magnetic field perturbations were initiated by rapid current dissipation through a circular antenna. It was observed that the initial radial nulls of the type in FIG. 3 were deformed into improper spiral nulls due to magnetic gradient-induced relaxation currents along the spine. However, no narrow current sheets, no anomalous resistivity, and no plasma vortices on the scale of the electron inertial length were reported. These noted discrepancies with two-fluid plasma dynamics in both resistive MHD and kinetic magnetic reconnection represent an incomplete laboratory attempt to control and study 3D magnetic reconnection modes.

All of the previously reported laboratory magnetic reconnection configurations were met with a limited degree of success due to their inability to drive one of the three modes of three-dimensional reconnection about an isolated magnetic null point 28 of FIG. 3: torsional spine reconnection, torsional fan reconnection, or spine-fan reconnection. These shortcomings render these various techniques as insufficient for fully describing the nature and origin of localized current sheet formation and current accumulation about isolated magnetic null points, as well as being insufficient for deciphering reconnection plasma heating and particle acceleration.

To date there is no laboratory experiment that can replicate the precise magnetic field topologies and plasma dynamics that exist in astrophysical environments, in which highly efficient charged particle acceleration along the spine axis 29 occurs. That is, there is no present apparatus capable of mimicking three-dimensional modes of magnetic reconnection, a scalable particle acceleration mechanism occurring across the wide range of length scales of astrophysical plasmas.

Thus, it is desirable for a magnetic reconnection system that can provide explicit control of a highly compact plasma sheet concentrated along the collimated, open magnetic field lines of the spine axis 29 that can propagate far from the reconnection region.

SUMMARY OF THE INVENTION

Some embodiments of the present invention provide methods and apparatuses for torsional magnetic reconnection. The present invention generally relates to the field of laboratory plasma physics and magnetic reconnection. Specifically, the invention relates to the field of plasma physics suitable for studies of three-dimensional modes of magnetic reconnection and their resultant particle acceleration processes. The invention additionally relates to systems that utilize the properties of magnetic reconnection to produce particle accelerations that can be used for numerous applications and research.

Further embodiments of the invention relate to laboratory plasma physics experiments. Current magnetic reconnection experiments are undertaken in relatively large tokamaks and spheromaks ($\leq 10$ m$^3$). Certain embodiments of the invention provide a plasma physics technology on the size scale of $\leq 1$ m$^3$. Accordingly, the invention is advantageous as this compact size will reduce the overall cost and laboratory space needed to conduct novel experiments in plasma physics and magnetic reconnection.

Still further embodiments of the invention induce torsional spine magnetic reconnection having as a result a focused beam of charged particles with scalable velocity profiles.

Additional embodiments of the invention induce torsional fan magnetic reconnection having as a result a focused beam of charged particles with scalable velocity profiles.

Still other embodiments of the invention induce spine-fan magnetic reconnection having as a result a focused beam of charged particles with scalable velocity profiles.

The present invention provides a method and apparatus for harnessing torsional magnetic reconnection and its resultant focused beam of charged particles with scalable velocity profiles, in some cases. Hence, the invention relates to any such device harnessing torsional magnetic reconnection as a particle accelerator and energy beam generator source. More specifically, plasma beams in accordance with the present invention are well adapted for use in numerous applications, including but not limited to, instances where modifications to, imaging of, and/or studying of work pieces or materials (including solids, liquids, gases, and plasmas) are desired. For example, certain embodiments may provide a focused energy beam generator source useful for (inter alia): welding, fusing, drilling, curing, cutting, melting/evaporating, treating, sterilizing, calibrating, developing, and/or heating of materials, as well as for providing thrust. Such objects and advantages of the invention will become clear from the discussions below, and more particularly through the following drawings and detailed description of the embodiment of the invention.

Yet other embodiments of the invention relate to focused ion beam (FIB) technology for the ablation and etching of material on the micrometer and nanometer scale. The invention is an upgrade in this field due to the high charged particle velocities induced and the scalability of ion species, lengths, and energies with which it operates, in some instances. The scale invariance of reconnection will allow for further instances of the invention to form wider beams than currently achieved by FIBs, thus further reducing milling time.

Still other embodiments of the invention relate to spacecraft propulsion. More specifically, certain instances of the invention can be used in a space vacuum environment above Earth's atmosphere as a propulsion system that utilizes the properties of magnetic reconnection to provide thrust to a spacecraft traversing a distance between arbitrary points in space as may be expected during space travel. The invention relates to the field of propulsion systems suitable for both human and robotic travel. Advantageous here, in relation to those embodiments of the invention, is the ability to provide high-specific impulse in-space propulsion capabilities.

Yet additional embodiments of the invention relate to use of radiation as medical treatment options and/or research. More specifically, certain embodiments can be used as an apparatus for generating high energy charged particles which can be channeled directly, or indirectly, toward living tissue with the intent of radiating and damaging cells considered to be harmful. Those embodiments can also act as the initial charged particle generator and accelerator within a vacuum chamber which then interacts with another material, either in a vacuum or in an atmosphere, to irradiate cells and/or tissue outside the vacuum chamber. Accordingly, those embodiments relate to, but are not limited to, medical sterilization processes to kill bacteria, molecular medicine where cell exposure to radiation is desired for treatment, and/or for the study of radiation impacts to humans, animals, and plants for the development of advanced treatment and/or radioprotectant methodologies.

Still other embodiments of the invention relate to calibration tools for numerous space instrumentation devices, as well as basic and applied research in energy, and advanced materials synthesis and manufacturing. Advantageously, the scale invariance of some aspects can generate focused high energy charged particles and light useful for laboratory calibration of space-based camera detector systems and mirrors. Certain instances of the invention can also act as a radiation source generator within a vacuum that provides directed and flexible high-energy beams useful for the study of material properties and functions applicable to space instrumentation development, new energy technologies, solar energy storage and delivery systems, low-and-high temperature superconductors, and generally advanced electrical storage and transportation systems. As described above, some embodiments provide a small-scale plasma physics technology. Additionally beneficial to its applications described here is the overall small laboratory space requirements (~1 m$^2$), as compared to the present large-sale facilities required to generate high-energy radiation sources (~1×10$^4$ m$^2$).

Still further examples of the invention can be used in numerous instances where secondary plasma heating is needed, as they will provide an apparatus that produces a directed and flexible energy spectra plasma beam. For example, certain examples can act as an insertion into experimental fusion and fission technology development programs as the central engine of an alternate inertial confinement heating mechanism, and/or acting as such for applied nuclear energy programs and/or the formation of medical isotopes. In some cases, for further example, fusion inertial confinement heating may employ one or more neutral particle beams supplied by certain embodiments of the present invention.

BRIEF DESCRIPTION OF THE DRAWINGS

Embodiments are illustrated by way of example, and not by way of limitation, in the figures of the accompanying drawings that serve to explain the principles of the invention. The drawings are only for the purpose of illustrating the embodiments of the invention and are not to be construed as limiting the invention. In the drawings.

DETAILED DESCRIPTION OF THE INVENTION

Figure 1:
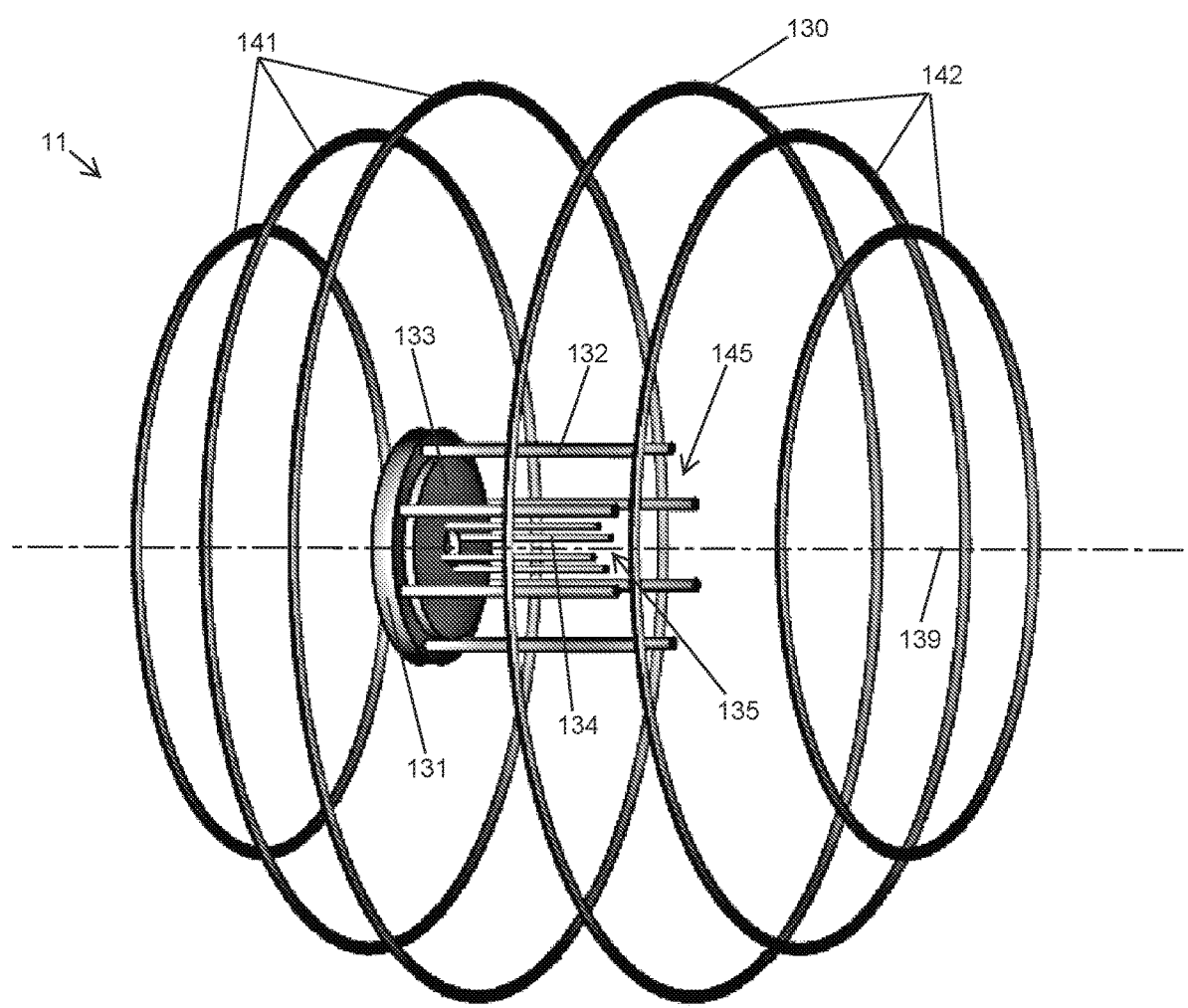
FIG. 1 depicts an embodiment of the invention with conducting coils and plasma sheath apparatus (PSA).
Figure 2:
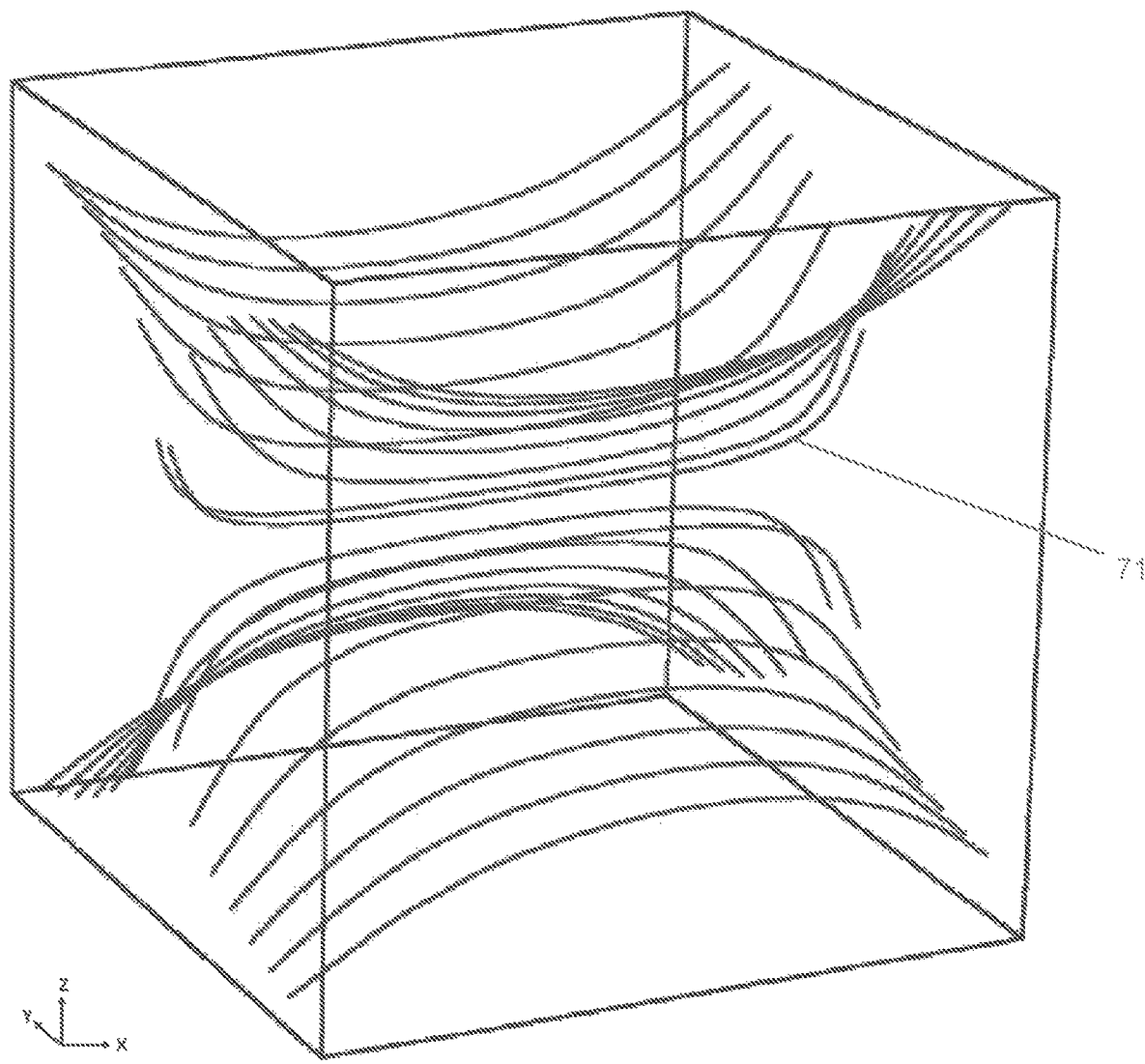
FIG. 2 depicts the classical model of a two-dimensional magnetic null with Y-shaped diffusion regions.
Figure 6:
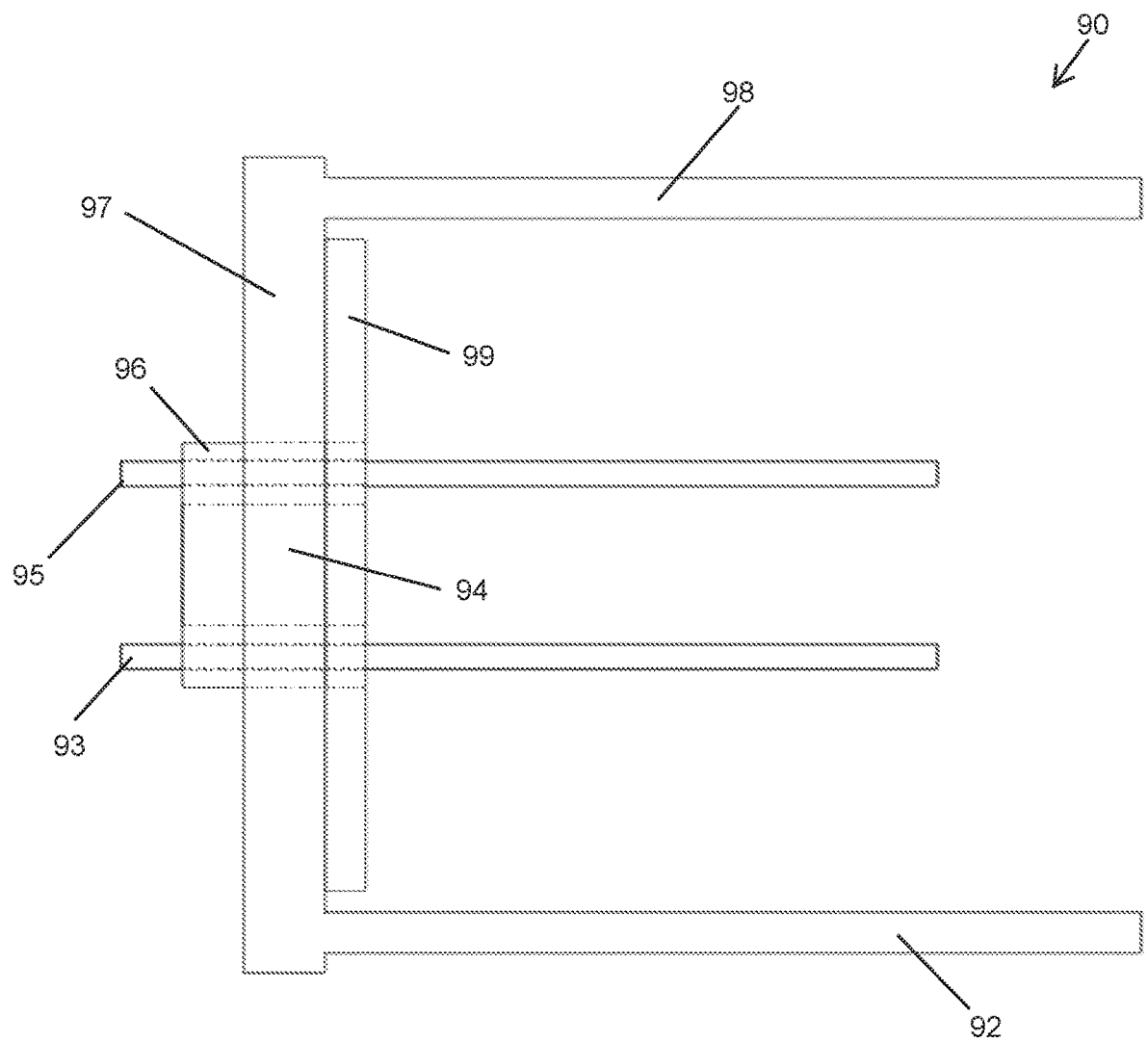
FIG. 6 depicts a PSA geometry cross-section in the axial direction.
Figure 7:
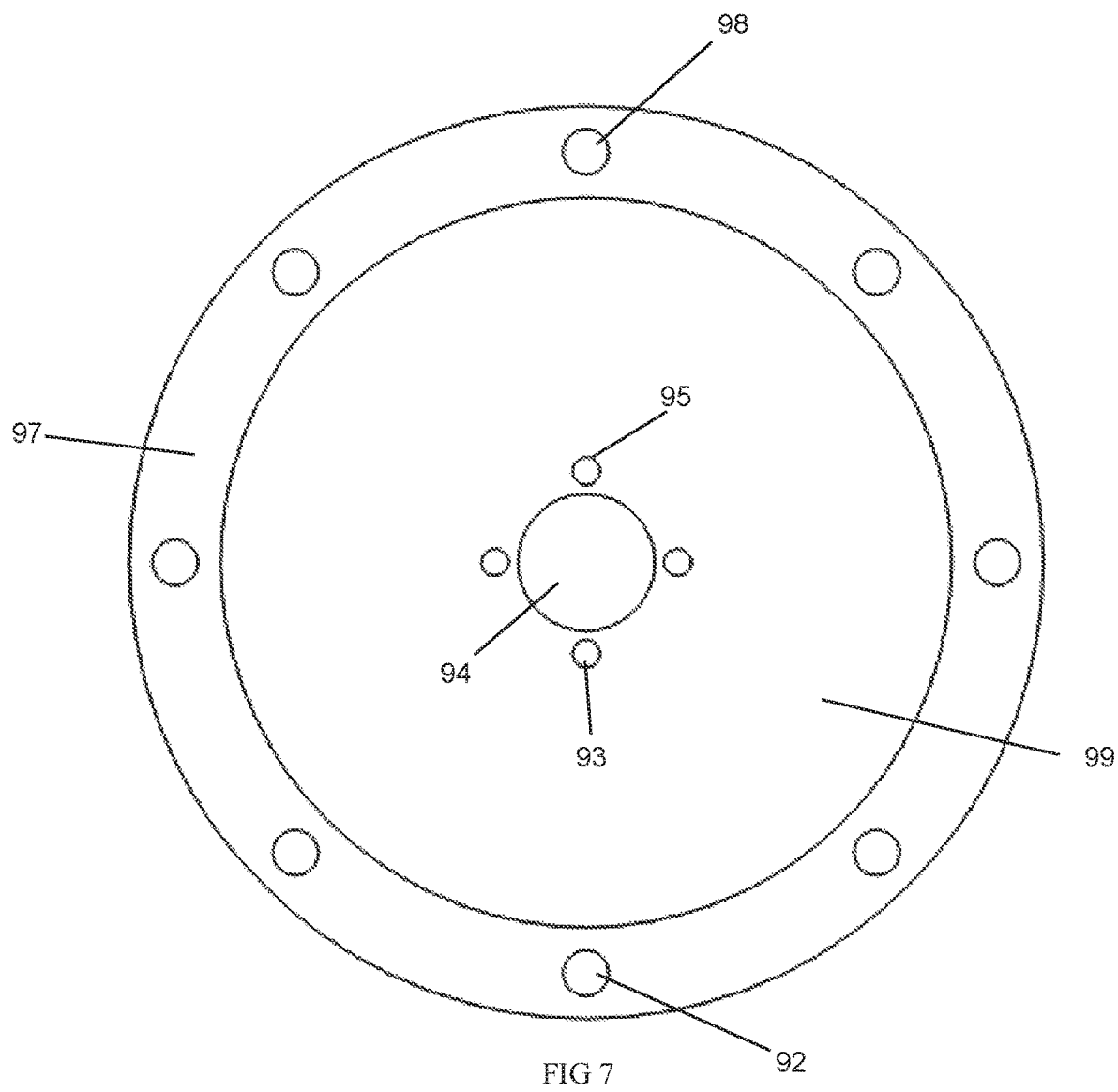
FIG. 7 depicts a PSA geometry in the radial direction.

With reference to the drawings, and more particularly to FIG. 1, FIG. 6, and FIG. 7, there is disclosed one embodiment of the invention of the torsional magnetic reconnection apparatus 11. Apparatus 11 useful for confining plasma and enabling torsional spine magnetic reconnection comprises: a conducting coil apparatus 130, comprising two hemispheres 141, 142 each adapted to carry oppositely flowing current, symmetrically displaced with respect to each other, further adapted to carry a plurality of electric currents for rapidly generating and maintaining a fan-spine magnetic field topology characterized by a spine axis normal to and intersecting a two-dimensional fan plane at a magnetic null, the two hemispheres having a longitudinal axis 139 colinear with the spine axis, and a center 135 co-located with the magnetic null;
a plasma sheath apparatus 90 having a plurality of outer electrodes 92, 98 connected to an outer electrode base 97, separated by an insulator 96 from and surrounding a plurality of concentrically-arranged inner electrodes 93, 95 and a plasma surface 99, mounted parallel with the spine axis and aligning the inner electrodes 93, 95 with the center 135 of the two hemispheres 141, 142, the plasma sheath apparatus 90 being adapted to generate and confine an axially propagating sheath of plasma, and to employ a high-voltage discharge delivered by a capacitor bank (not shown) and electrical bus (not shown) to drive the axially propagating sheath of plasma into the magnetic null to induce an azimuthal magnetic field perturbation that forms current sheets and forces magnetic field line diffusion through the plasma, thereby enabling torsional spine magnetic reconnection.

Apparatus 11 could further comprise a vacuum environment housing, or it could operate in a vacuum or near-vacuum environment such as in space outside Earth's atmosphere.

Magnetic reconnection is inherently a scale invariant process, so the length and energy scales of the apparatuses related to the field of this invention can be altered to be idealized for many embodiments Table 1. As a limited demonstration of the size and energy scalability of the invention, we first consider requisite MHD and kinetic scaling parameters of laboratory-generated plasmas (Table 1). Note that the identified Figure of Merit from Table 1 is that under satisfaction of MHD conditions (Lundquist Number>>1), the ion skin depth is of the same order or larger than the ion gyroradius. This can also be shown to be true for electrons under the same conditions. Perturbations to these plasma states initiate the breakdown of MHD conditions and the demagnetization of electrons (reconnection).

TABLE 1

Scaling parameters for the induction of torsional magnetic reconnection in laboratory plasmas. Solar regime is protons, other ions are deuterium.

| Type | Number Density | Length Scale | Magnetic Field | Lundquist Number | Ion Gyro-radius | Ion Skin Depth |
|---|---|---|---|---|---|---|
| Solar Corona | $10^{15}$ m$^{-3}$ | 10 km | 0.01 T | $10^{10}$ | 10 cm | 10 m |
| Warm Plasma | $10^{20}$ m$^{-3}$ | 10 cm | 0.01 T | $10^2$ | 5 cm | 3 cm |

TABLE 1-continued

Scaling parameters for the induction of torsional magnetic reconnection in laboratory plasmas. Solar regime is protons, other ions are deuterium.

| Type | Number Density | Length Scale | Magnetic Field | Lundquist Number | Ion Gyro-radius | Ion Skin Depth |
|---|---|---|---|---|---|---|
| Hot Plasma | $10^{20}$ m$^{-3}$ | 1 cm | 0.1 T | $10^3$ | 1 cm | 3 cm |
| Dense Hot Plasma | $10^{24}$ m$^{-3}$ | 1 cm | 10 T | $10^3$ | 0.1 mm | 0.3 mm |
| Dense Plasma | $10^{24}$ m$^{-3}$ | 1 cm | 1 T | $10^3$ | 0.2 mm | 0.3 mm |

One embodiment of the present invention utilizes the operation of a plasma sheath apparatus (PSA) within a unique magnetic field configuration externally generated by conducting coils. Another embodiment employs a dense plasma focus apparatus. For convenience, except as indicated by context, "PSA" as used herein will refer to both plasma sheath apparatuses and dense plasma focus apparatuses.

Certain embodiments operate within a near-vacuum environment. Typical gas pressures within this vacuum environment are in the approximately 1-30 millibar range, corresponding to approximately 1-20 Torr. In the embodiment of FIG. 1, two hemispheres 141, 142 containing conducting coil windings, each with a tapered geometry and opposing current directions, generate the three-dimensional magnetic field configuration having magnetic field lines 27, which are in the fan plane 30, and approach the spine axis 29 in FIG. 3. Null 28 is also indicated. Each hemisphere of the coils can comprise any suitable geometrical configuration of any arbitrary number of conducting coil windings for forming and confining the 3D fan-spine magnetic field topology and strength necessary for the embodiment of the invention to induce torsional magnetic reconnection. The embodiment in FIG. 1 demonstrates a tapered shape of each conducting coil winding hemispheres 141, 142, where the equatorial coils have a larger toroidal radius than those along the outer poles. Any geometry of this embodiment that forms a magnetic null in the fan-spine topology FIG. 3 can be used. For example, circular, non-circular, single layer, multi-layer, among other coil geometries may be mentioned.

Figure 4:
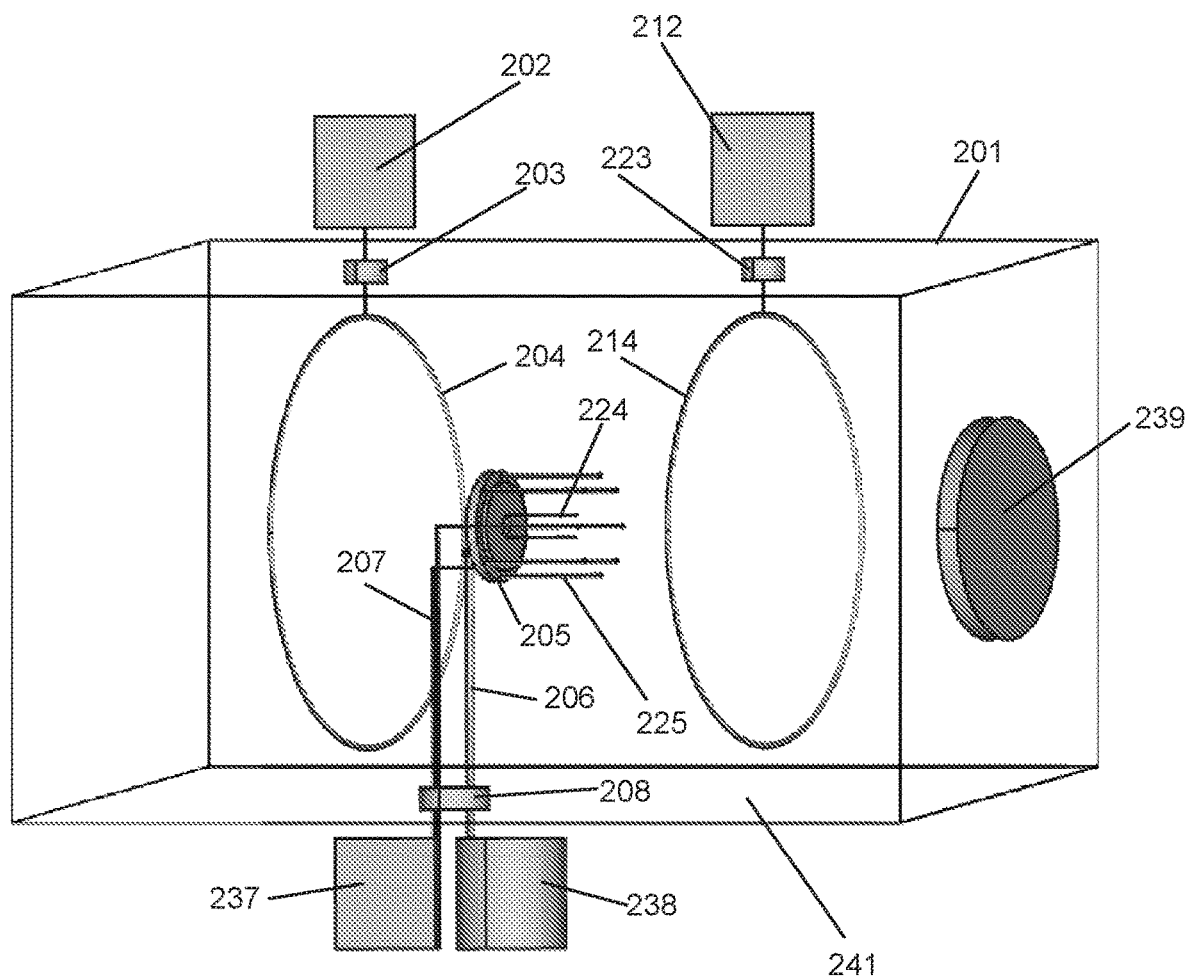
FIG. 4 depicts an embodiment of a laboratory setting of the invention.

In an embodiment of a laboratory setting of the invention in FIG. 4, the two hemispheres represented by coils 204, 214 of any arbitrary geometrical configuration and carrying opposing current are each coupled to their own arbitrary power supplies 202, 212 providing identical voltage and current. The two hemispheres represented by coils 204, 214 are housed in the vacuum environment housing 201 by means of respective insulated conductors as a base 203, 223. In this embodiment, each of the coil hemispheres can carry on the order of 100 kiloamps and be comprised of copper technology. However, in any embodiment of the invention, the two coil hemispheres may include any arbitrary composition of, for example, multi-layered helical conducting coil technology that produces a static or potential magnetic field satisfying MHD conditions, including, but not limited to conducting metals such as copper, and also superconductor technology.

Each conducting coil hemisphere of tapered geometry away from the equatorial region can be formed by either a multi-layered helical conductor with a single insulating mount and a single power supply, or of a plurality of tapered geometry coils of hemispheres 141, 142 each with their own insulating mount and individual power supply, such as that showed in the embodiment of FIG. 1.

In some embodiments of the invention, the toroidal radius and spacing of a plurality of axially aligned conducting coils can be determined by solving the inverse problem for the discrete path of source electrical current geometry via the Biot-Savart Law. In the presented embodiment of FIG. 1, the solution for two axially aligned hemispheric conducting coil configurations 141, 142, each with three loops, have inner major toroidal radius 20 centimeters and outer minor toroidal radius 10 centimeters, with each individual loop offset in the axial direction from one another by 5 centimeters.

Figure 3:
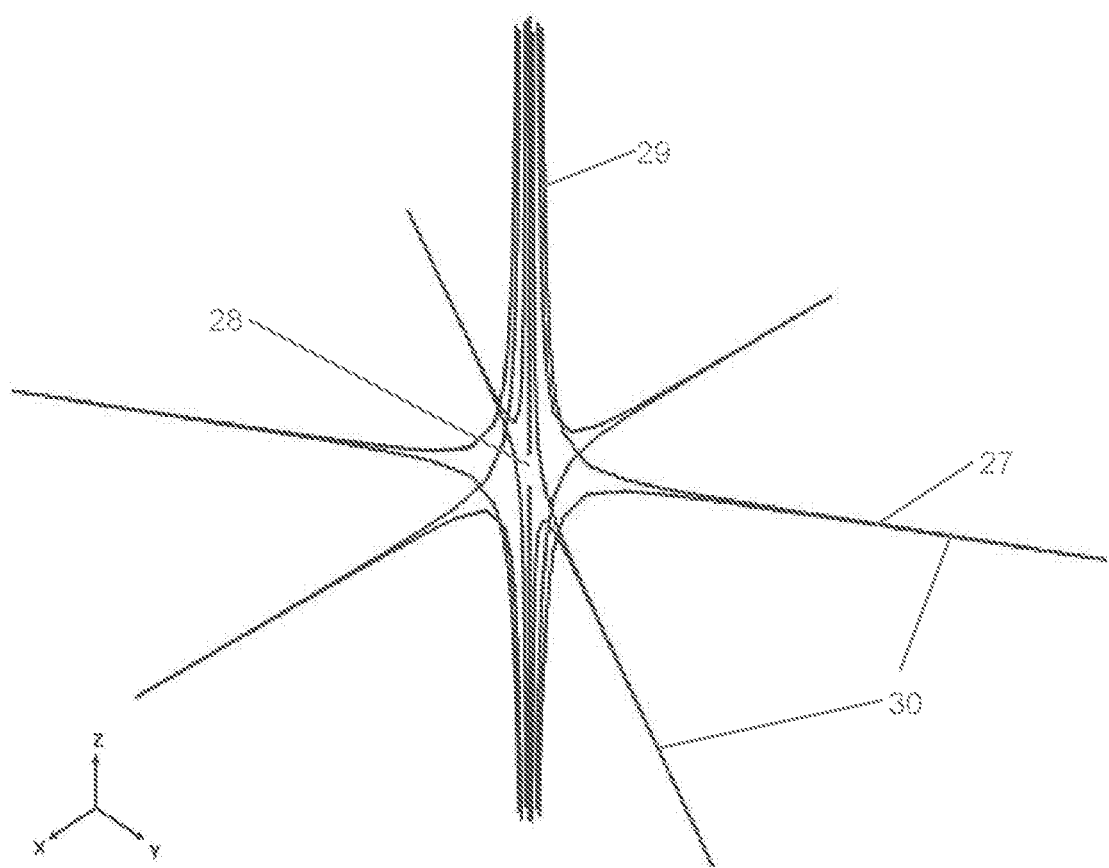
FIG. 3 depicts streamlines of a radial magnetic null point field.
Figure 10:
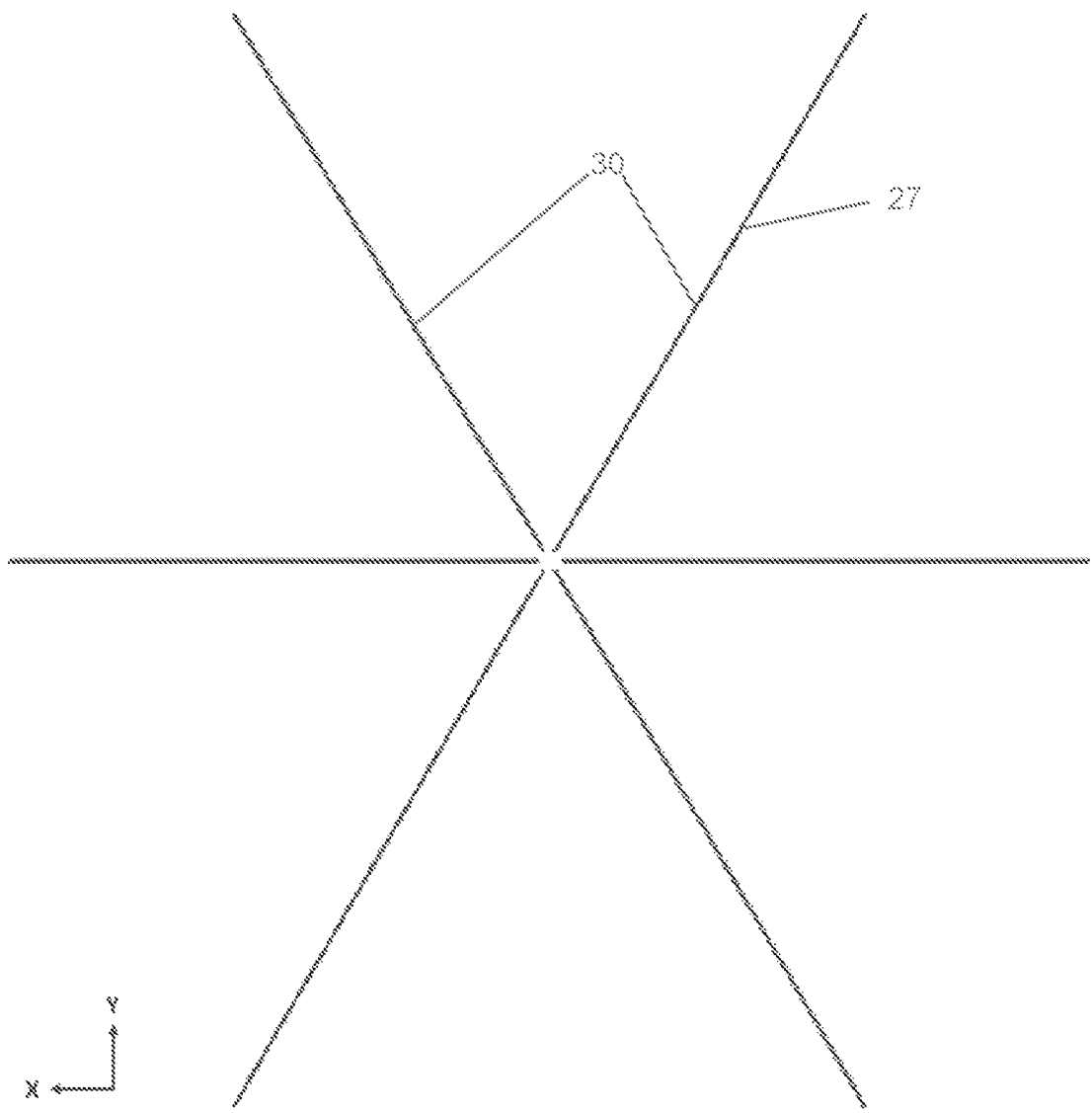
FIG. 10 depicts streamlines of a radial magnetic null point field fan plane.
Figure 11:
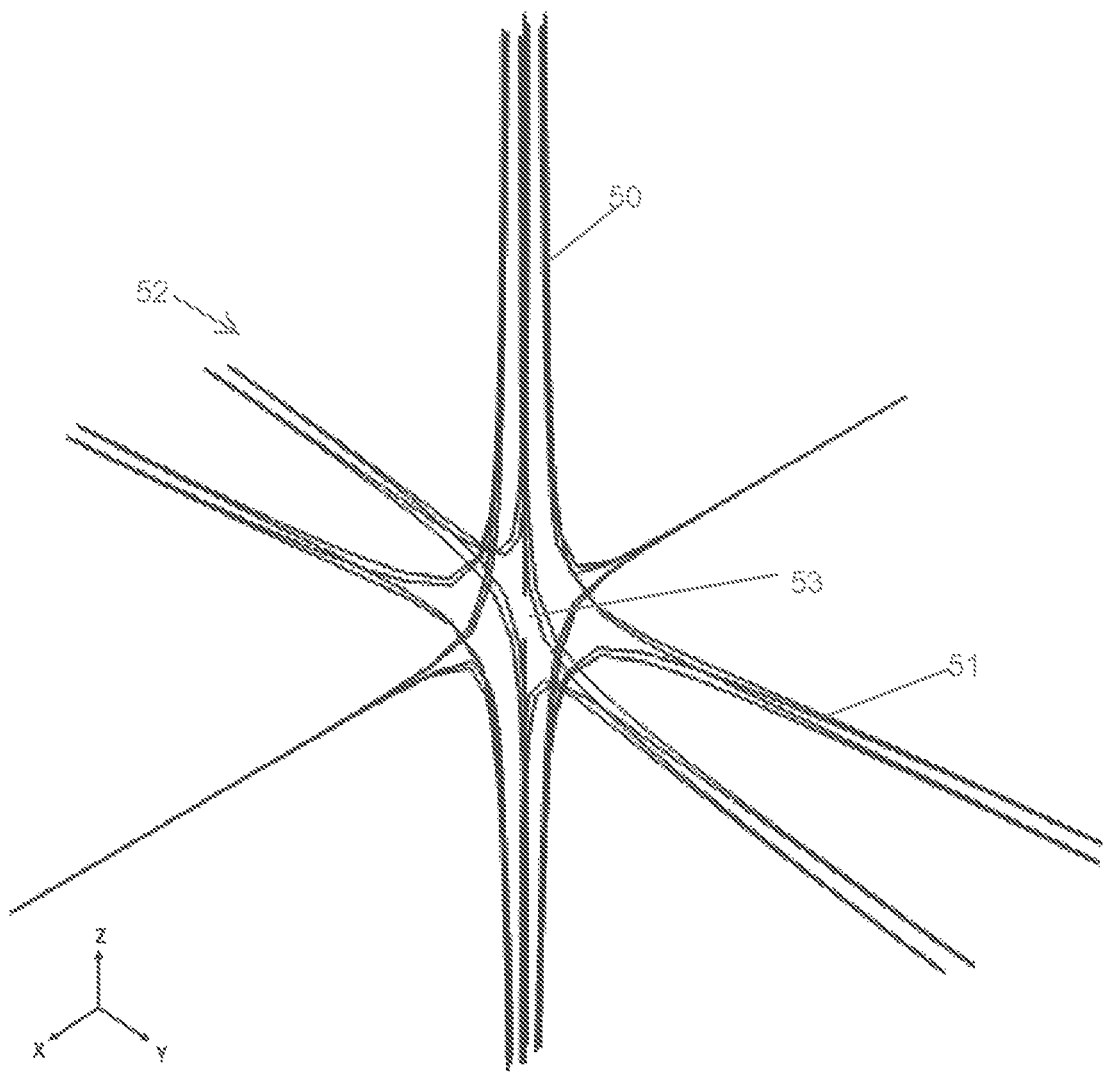
FIG. 11 depicts streamlines of an improper magnetic null point field.
Figure 12:
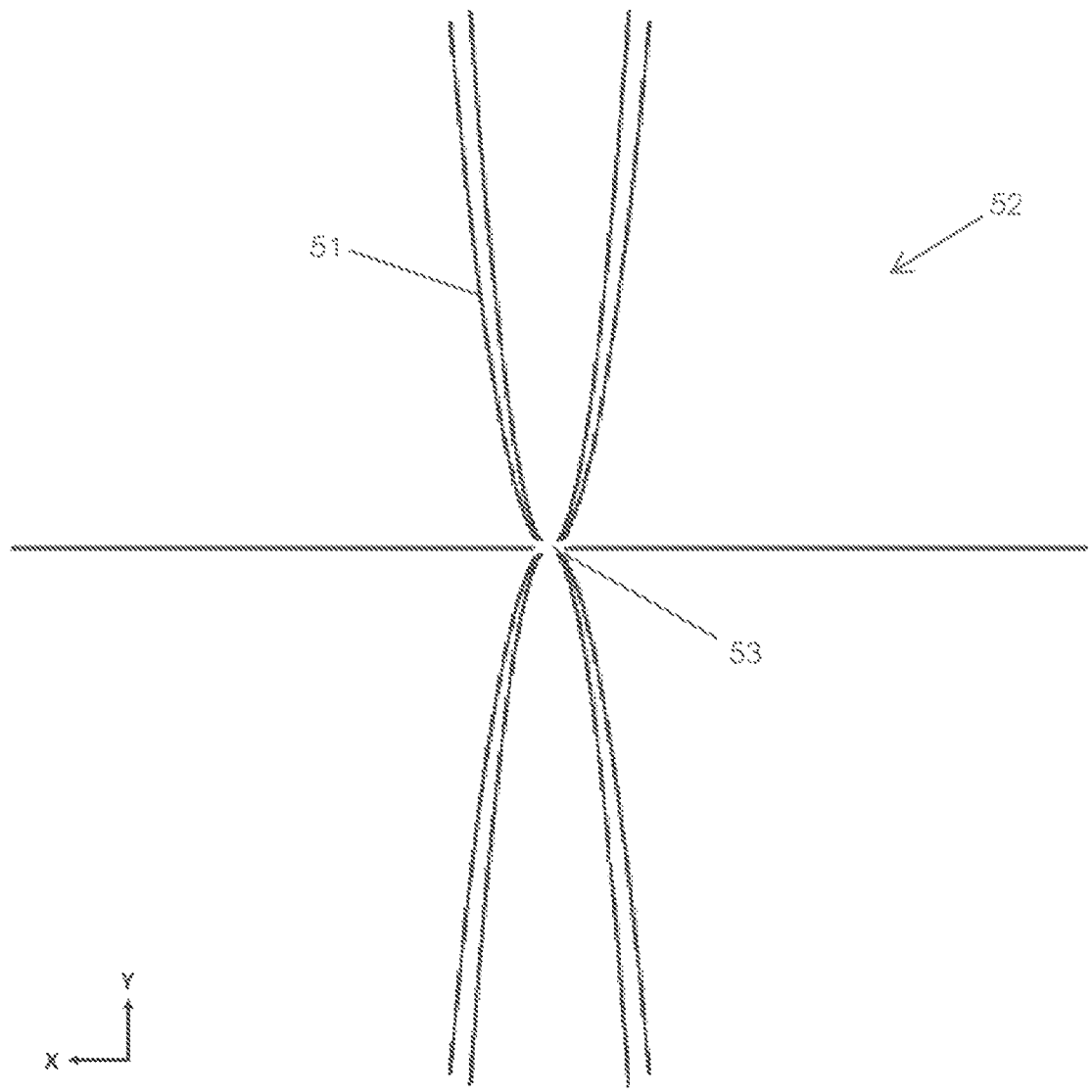
FIG. 12 depicts streamlines of an improper magnetic null point field fan plane.

Alternative to the radially symmetric null point depicted in FIG. 3 and FIG. 10 is an improper magnetic null point, shown in FIG. 11, where the magnetic field lines of the fan plane that point toward or away from the null point 53 are non-uniformly distributed and more densely populated in one dimension of the fan plane 51 as seen from above in FIG. 12. The spine axis 50 field lines are still collimated in the improper null point topology 52. These two manifestations of the magnetic field generated by the external coil configurations of hemispheres 141,142, and 204, 214 and any variation of these generalized magnetic null point geometries with two-dimensional fan plane and spine axis are required to induce the modes of torsional magnetic reconnection featured in the invention system.

Figure 5:
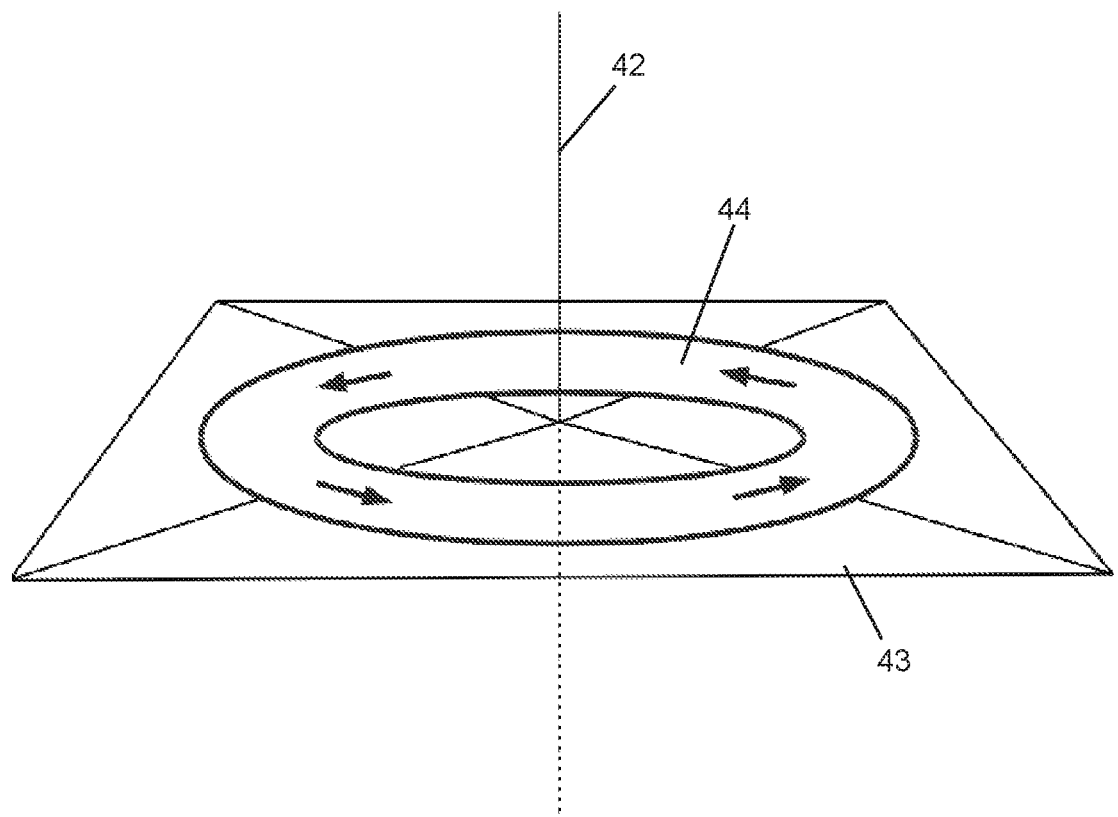
FIG. 5 depicts the fan-spine topology of a radial magnetic null point field featuring a circular magnetic field perturbation in the fan plane centered around the spine axis.

Some embodiments of the present invention require that a plasma introduce a rotationally driven magnetic field perturbation that will lead to an instability resulting in current sheet formation and allowing for torsional magnetic reconnection to take place. Certain embodiments further comprise a PSA 90, 205 that resides toward the center of the magnetic null point field of the conducting coils 130, 204, 214 so that a circular magnetic field perturbation 44 is provided to the fan plane 43 and centered around the spine axis 42. See FIG. 5.

A generalized PSA geometry is introduced and described that is optimized for the operation of the embodiment of the invention. FIG. 6 and FIG. 7 depict axial and radial cross-sections of a PSA apparatus 90, respectively. The PSA apparatus 90 is adapted for mounting to a mounting plate 208 within the vacuum environment housing 201. See FIG. 4. The mounting plate 208 is an insulating dielectric so as to not interfere with the formation and propagation of the plasma dynamics or the magnetic field of the conducting coils 204, 214. The PSA mounting bracket attaching it to the vacuum environment wall 241 are both adapted for threadily engaging the PSA 205 and the vacuum environment wall 241 by means of a plurality of mounting bolts (not shown). A vacuum seal (not shown), comprised of a synthetic rubber and fluoropolymer elastomer, such as those sold under the Viton® brand, is disposed around the periphery of the vacuum environment wall 241 and the PSA mounting plate 208. Referring to FIG. 6 and FIG. 7, a cylindrical conducting outer electrode base 97 electrically-connected to any number of outer electrodes 92, 98 with arbitrary cross-sectional geometry extending in the axial direction, is electrically-disconnected by an insulator 96 from a plurality of narrow, concentrically arranged, inner electrodes 93, 95 of any arbitrary cross-sectional geometry that are themselves electrically connected. In the PSA 90, the inner electrode 95 as a whole is not necessarily a singular structure, but each of the inner electrodes 93, 95, for example are electrically connected to each other. The inner electrodes 93, 95 of the PSA 90 can be any arbitrary series of narrow, concentric conducting bars of any arbitrary cross-sectional geometry 93, 95. Geometrical variations of these embodiments of the PSA excludes the dense plasma focus (DPF) apparatus, which is characterized by a single, solid cylindrical inner electrode, but the DPF forms an additional embodiment of this invention.

Interior to the concentric plurality of inner electrodes 93, 95, and residing at the center of the conducting outer electrode base 97, the insulator 96, and plasma surface 99, can be a hole 94. Geometrical variations of this embodiment of the PSA 90 include those with a hole 94 with arbitrary radius, and those without a hole.

The inner and outer electrodes, and outer electrode base, are typically made from copper, but can be extended to any other electrically conducting material. The PSA inner electrodes can be made of the same or different electrically conducting material as the outer electrodes or outer electrode base. On the inner surface of the outer electrode base and covering the insulator is a plasma surface 99, typically ceramic or glass, to facilitate the initial formation of plasma. Plasma production occurs by a high voltage supplied by a capacitor bank 237 and connected across the outer electrodes 92, 98, and the inner electrodes 93, 95, by an electrical bus 207 fed into the vacuum environment. The electrical polarity of the connection is typically negative on the outer electrodes 92, 98, (cathode) and positive on the inner electrodes 93, 95 (anode). However, this connection can be switched, or the cathode can be grounded, as long as there is sufficient electrical discharge energy for plasma production for the intended use of the apparatus.

The entire apparatus operates within a sufficient vacuum environment housing 201, as described above, that allows for the electrical breakdown of an ambient gas, typically deuterium, and is sufficient for a relatively long-lived plasma state. Deuterium is only one possibility for the choice of ambient gas in the invention system. Other gases such as, but not limited to, neon, argon, xenon, and iodine, including isotopes of any gas, can be chosen singly and in combination.

In one embodiment of the invention, the process of plasma production begins with a gas reservoir 238, external to the vacuum environment housing 201, feeding gas to the PSA via an insulated pipe 206 and valve through the insulated bracket mounting plate 208. The wiring of the electrical bus 207 powering the PSA is also run through the insulated mounting plate 208 and protected from the vacuum environment by an apparatus such as a concentric insulated dielectric tube encompassing the gas pipe 206. Once a sufficient gas pressure within the inner electrodes 224 and outer electrodes 225 of the PSA 205 is achieved, the capacitor bank 237 can be discharged. This capacitor bank discharge and the gas flow into the PSA are timed as such to allow for a repeated, pulsed production of plasma linked to a gas pressure gradient between the vacuum environment and the gas reservoir. Each series of capacitor bank charge-discharges is expected to last on the order of microseconds as electron energization and demagnetization corresponds to Alfven wave perturbations and fast reconnection shorter than the timescales predicted by resistive diffusion. The plasma and magnetic field dynamics of such continuously applied discharges in a temporally-optimized fashion can allow for the quasi-steady state persistence of a resulting spine-localized plasma flow for the period of the capacitor bank discharging. It can be said that plasma sheath apparatus 205 is adapted to generate and confine an axially propagating sheath of plasma, and to employ a high-voltage discharge delivered by a capacitor bank 237 and electrical bus 207 to drive the axially propagating sheath of plasma into the magnetic null of conducting coils 204, 214 to induce an azimuthal magnetic field perturbation that forms current sheets and forces magnetic field line diffusion through the plasma, thereby enabling torsional spine magnetic reconnection. Window 239 allows for observation, in some instances, or for a particle beam to exit from vacuum environment housing 201.

Figure 8:
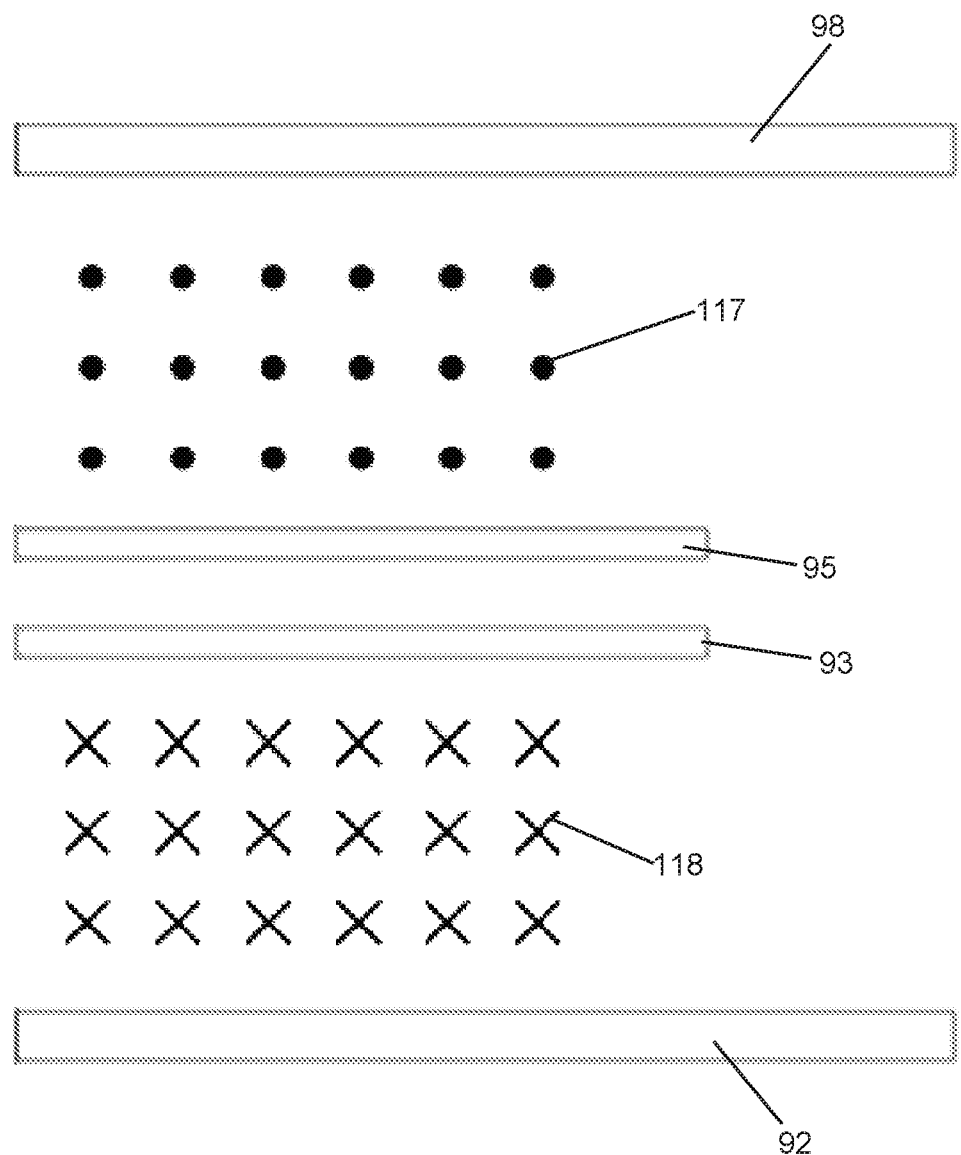
FIG. 8 depicts the PSA magnetic field between the electrodes.
Figure 9:
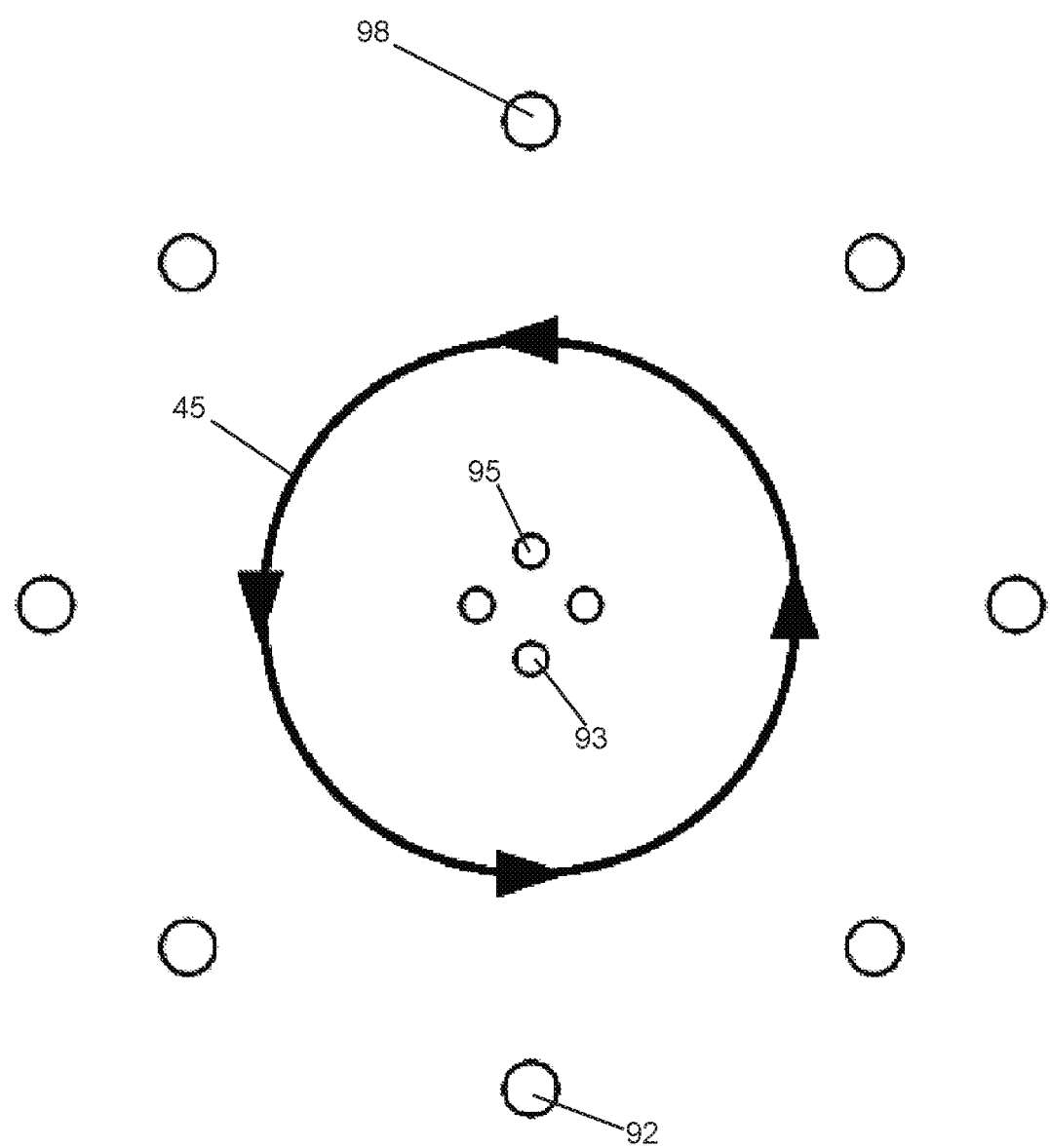
FIG. 9 depicts the PSA azimuthal magnetic field.

The basis of operation in some embodiments of the present invention relies on the interaction of the magnetic fields between the PSA 90, 205 and the external coil configuration of hemispheres 141, 142 or 204, 214. The plasma sheath generated by the PSA 90, for example, and propagating down its axial direction produces an azimuthal (circular) magnetic field 117, 118 between the outer electrodes 92, 98 and inner electrodes 93, 95. The plasma sheath generated at the plasma surface 99 is accelerated down the axial direction between the electrodes by its self-Lorentz force (J×B). This azimuthal magnetic field, depicted in FIG. 8 as out of the page 117 above the inner electrodes 93, 95 and into the page 118 below the inner electrodes 93, 95 is circular in nature around this axial direction. FIG. 9 shows the azimuthal magnetic field direction 45 in between the outer electrodes 92, 98 and inner electrodes 93, 95 when looking down the axis of the PSA 90. The circular magnetic field direction of 45, 117, 118 can also be reversed to produce the desired magnetic field and plasma dynamics of the invention.

The null point magnetic field of this type that is required to be produced by a conducting coil configuration of hemispheres 141, 142, or 204, 214 outside of the interior PSA 90, 205 in an inventive system can reside either internal or external to the vacuum environment housing 201. The generalized PSA is to be situated within this externally-generated magnetic field and operate in the same fashion as described previously. The cylindrical axis of the outer electrode base 97, outer electrodes 92, 98, and inner electrodes 93, 95, are to be aligned with the magnetic field topology in a precise fashion, as will be described below.

Figure 13:
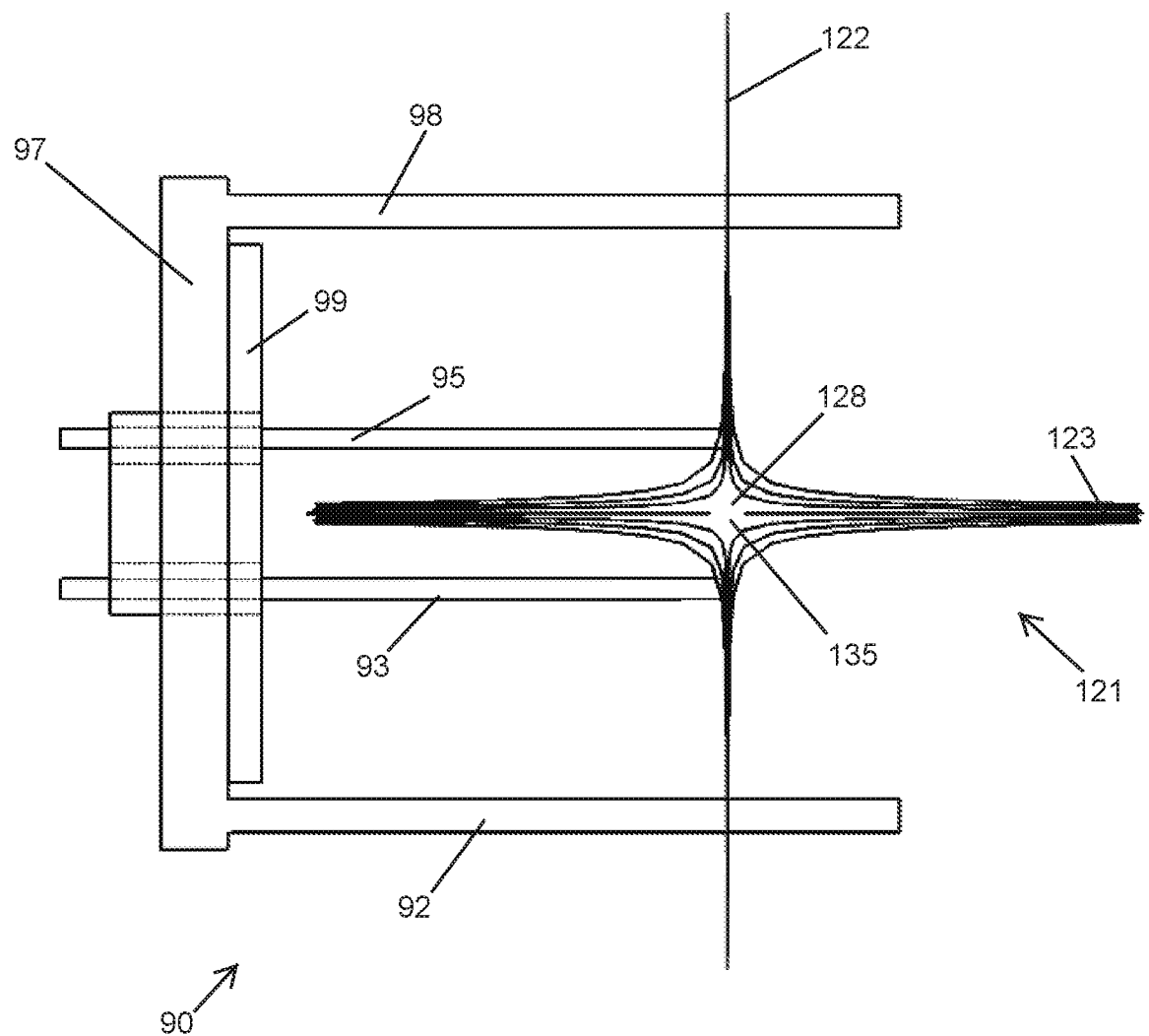
FIG. 13 depicts an axial view of a PSA immersed in streamlines of a radial magnetic null point field. The central anodes are concentric about the spine axis.
Figure 14:
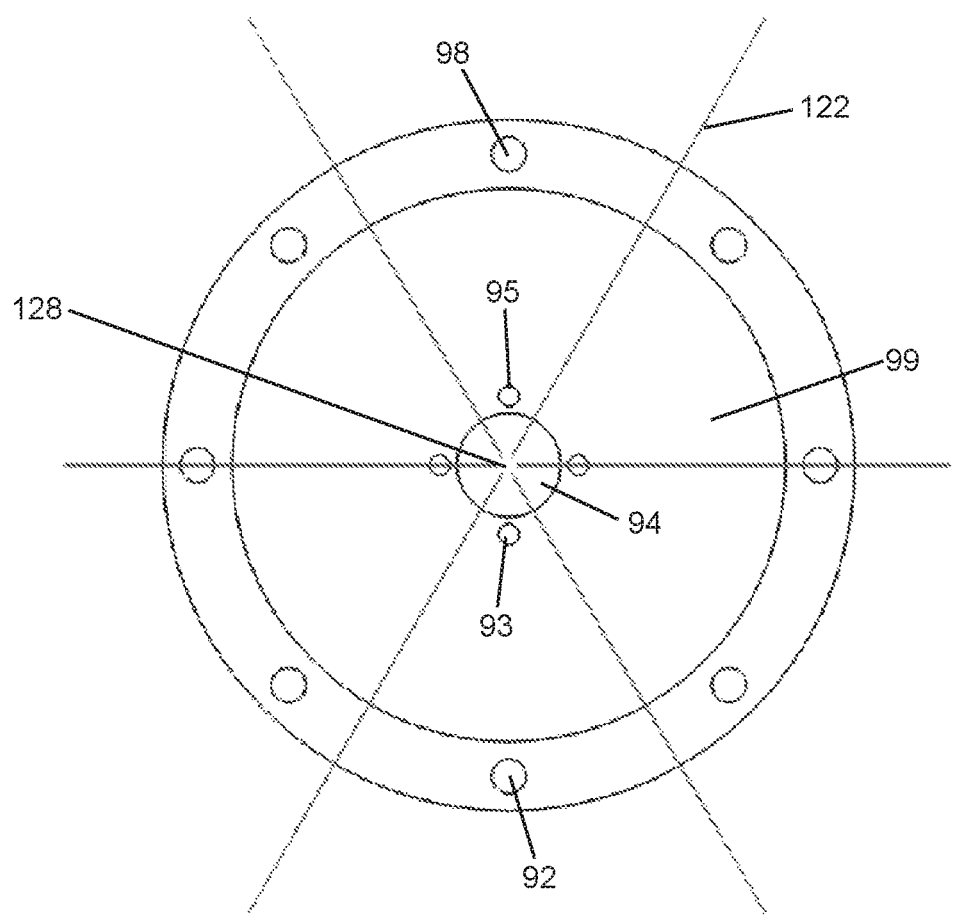
FIG. 14 depicts a radial view of a PSA immersed in streamlines of a radial magnetic null point field fan plane. The central anodes are concentric about the spine axis.

Again, the coincident operation of a PSA apparatus 90, 205 inside an external conducting coil configuration forming an arbitrary magnetic null point field, FIG. 1 and FIG. 4, is the principle of operation for certain embodiments of the invention. The alignment of the PSA apparatus 90 inside conducting coils of hemispheres 141, 142 follows the depiction in FIG. 13 in some embodiments. The conducting coils of hemispheres 141, 142 are not shown in FIG. 13, but streamlines of its produced null point magnetic field 121 are shown. Center 135 of two hemispheres 141, 142 is co-located with magnetic null 128. The magnetic field lines are shown from the perspective of looking down upon a horizontally oriented spine axis 123, with the fan plane 122 parallel to the line of sight. The orientation of the inner electrodes 93, 95 is to be parallel to and concentric about the spine axis 123. In this embodiment, the magnetic null point region is shown to coincide with the tip of the inner electrodes 93, 95, however, the location of the null point can be at any arbitrary position along the axial direction of the PSA 90 that will produce the desired torsional magnetic reconnection dynamics, but the null 128 must be centered around the PSA inner electrodes 93, 95 in the radial direction along fan plane 122. Both FIG. 13 and FIG. 14 depict a radial null point field with symmetric fan plane 122, but can be altered to any arbitrary form of an improper null point field 51 while still being centered along the radial direction down the axis of the PSA inner electrodes. FIG. 14 depicts a radial view of a PSA immersed in streamlines of a radial magnetic null point field fan plane. The central anodes are concentric about the spine axis. The geometrical positioning of the PSA in this embodiment, with its open central electrode geometry, allows the plasma to access the magnetic field of the spine axis via propagation into the central region within the concentric PSA inner electrodes 93, 95.

Figure 15:
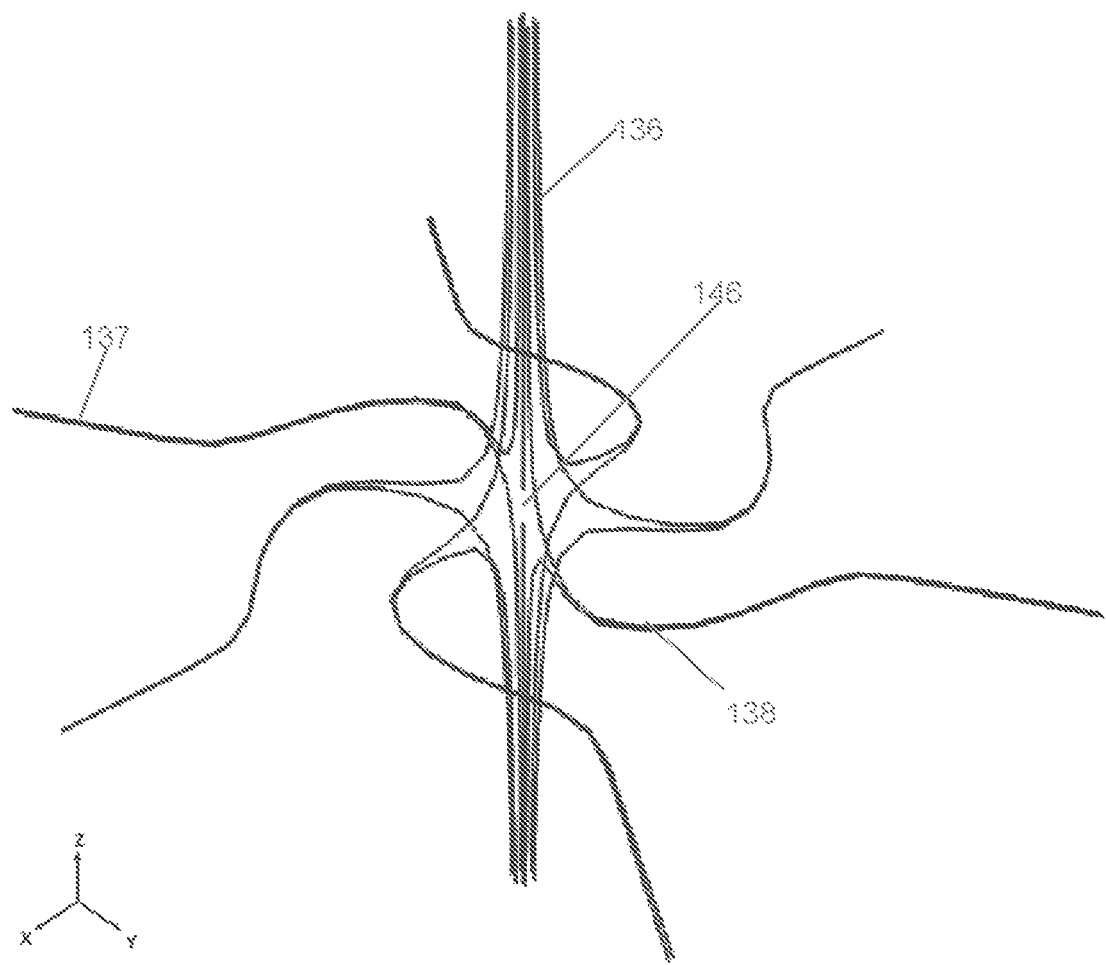
FIG. 15 depicts streamlines of a perturbed radial magnetic null point field.
Figure 16:
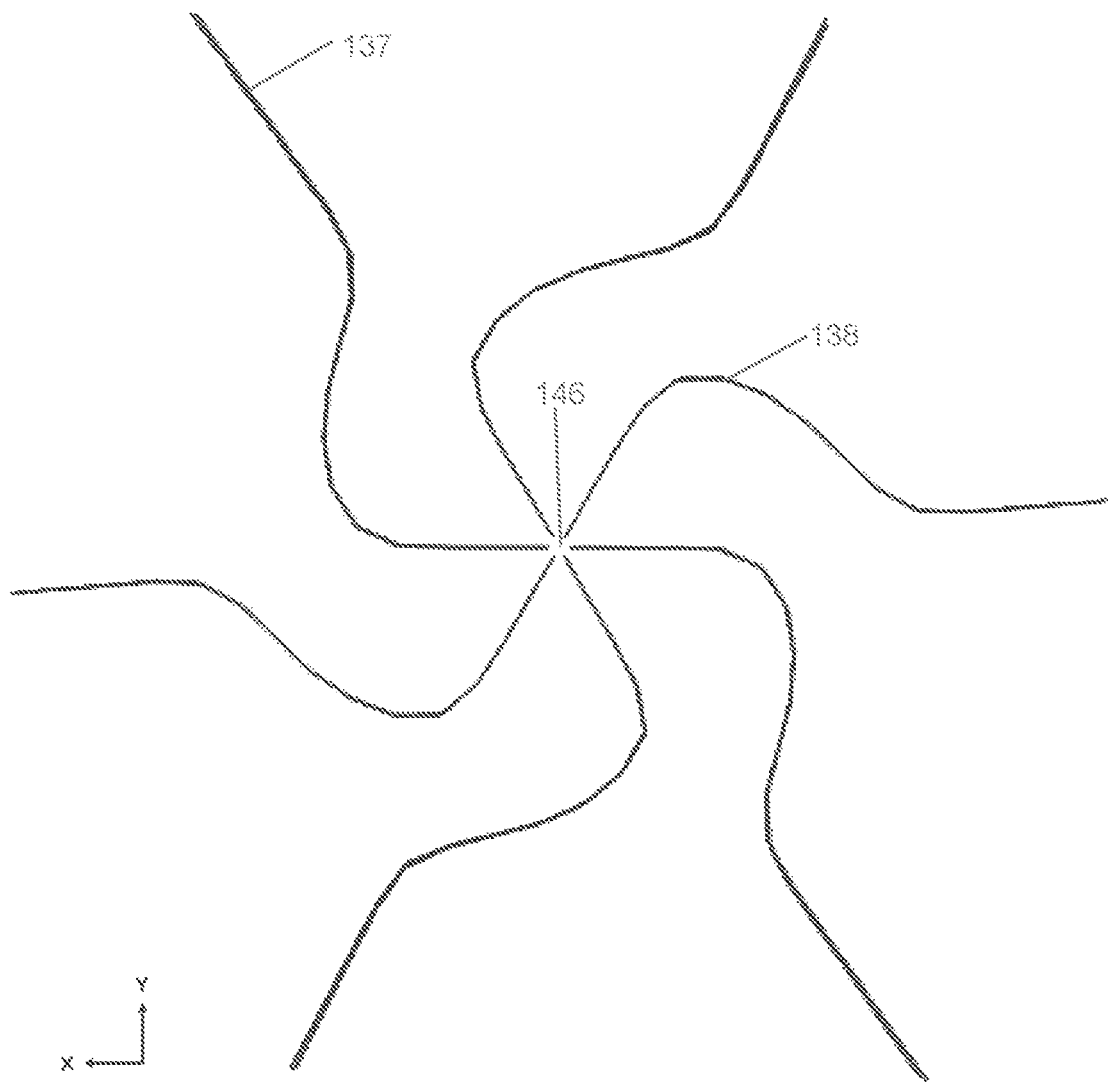
FIG. 16 depicts streamlines of a perturbed radial magnetic null point field fan plane.
Figure 17:
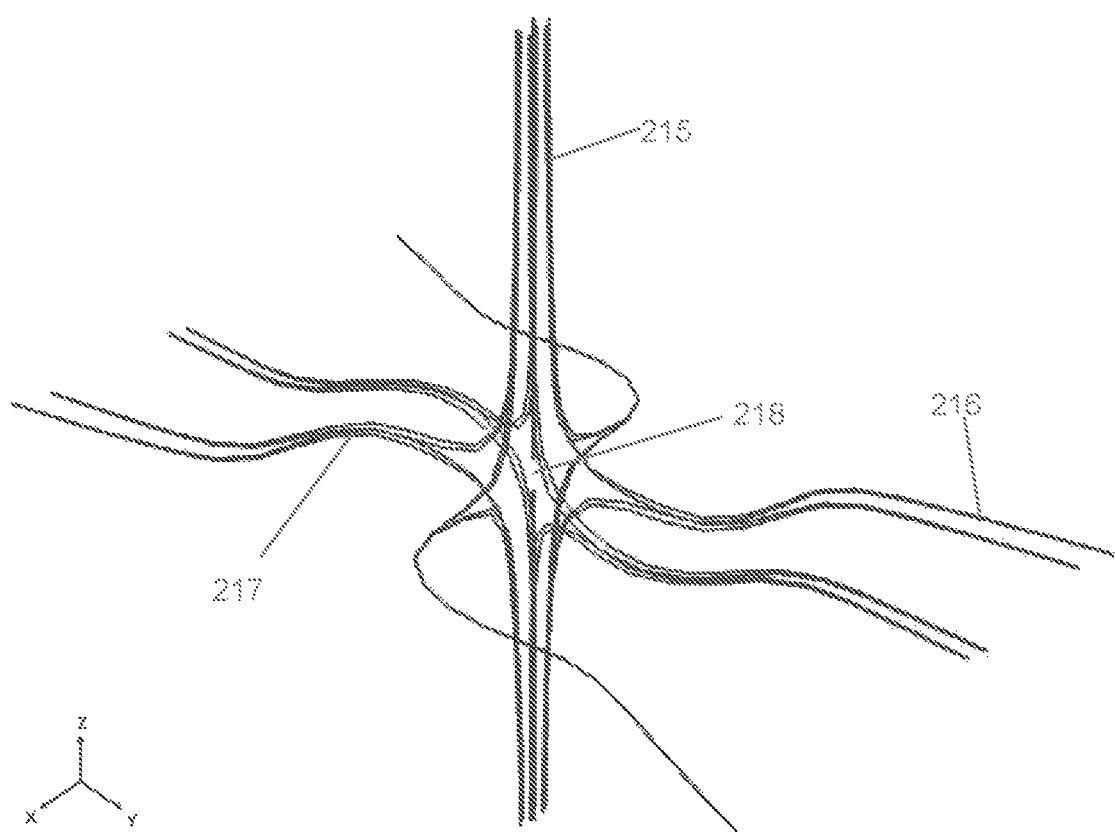
FIG. 17 depicts streamlines of a perturbed improper magnetic null point field.
Figure 18:
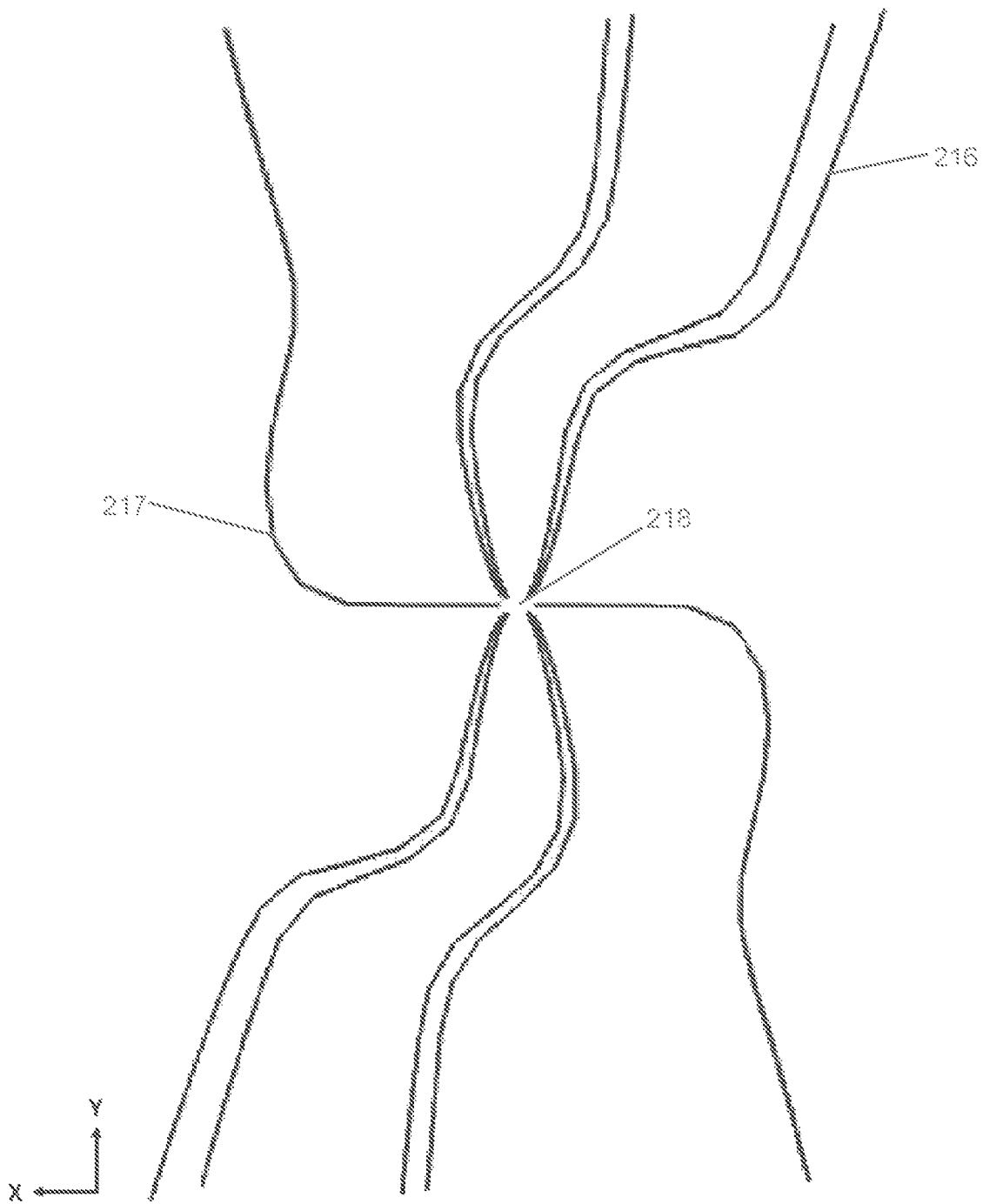
FIG. 18 depicts streamlines of a perturbed improper magnetic null point field fan plane.

Torsional magnetic reconnection in this embodiment of the invention manifests due to the time-dependent superposition of the magnetic fields of the PSA 90 plasma sheath and the conducting coil magnetic field fan plane 122. During the operation of the configuration with the PSA 90 in FIG. 13 and FIG. 14, the fan plane magnetic field will be perturbed or distorted. This distortion 138 to the fan plane 137 of a radial null point magnetic field is shown in FIG. 15, with the fan plane geometry shown in FIG. 16 where 138 is the distortion to the radial fan plane 137, and centered around the null point 146. Field lines collimate along spine axis 136. The identical circular perturbation can be applied to any arbitrary form of an improper null point field, FIG. 17 and FIG. 18, where the distortion 217 to the fan plane 216 is still centered around the null point 218.

Figure 19:
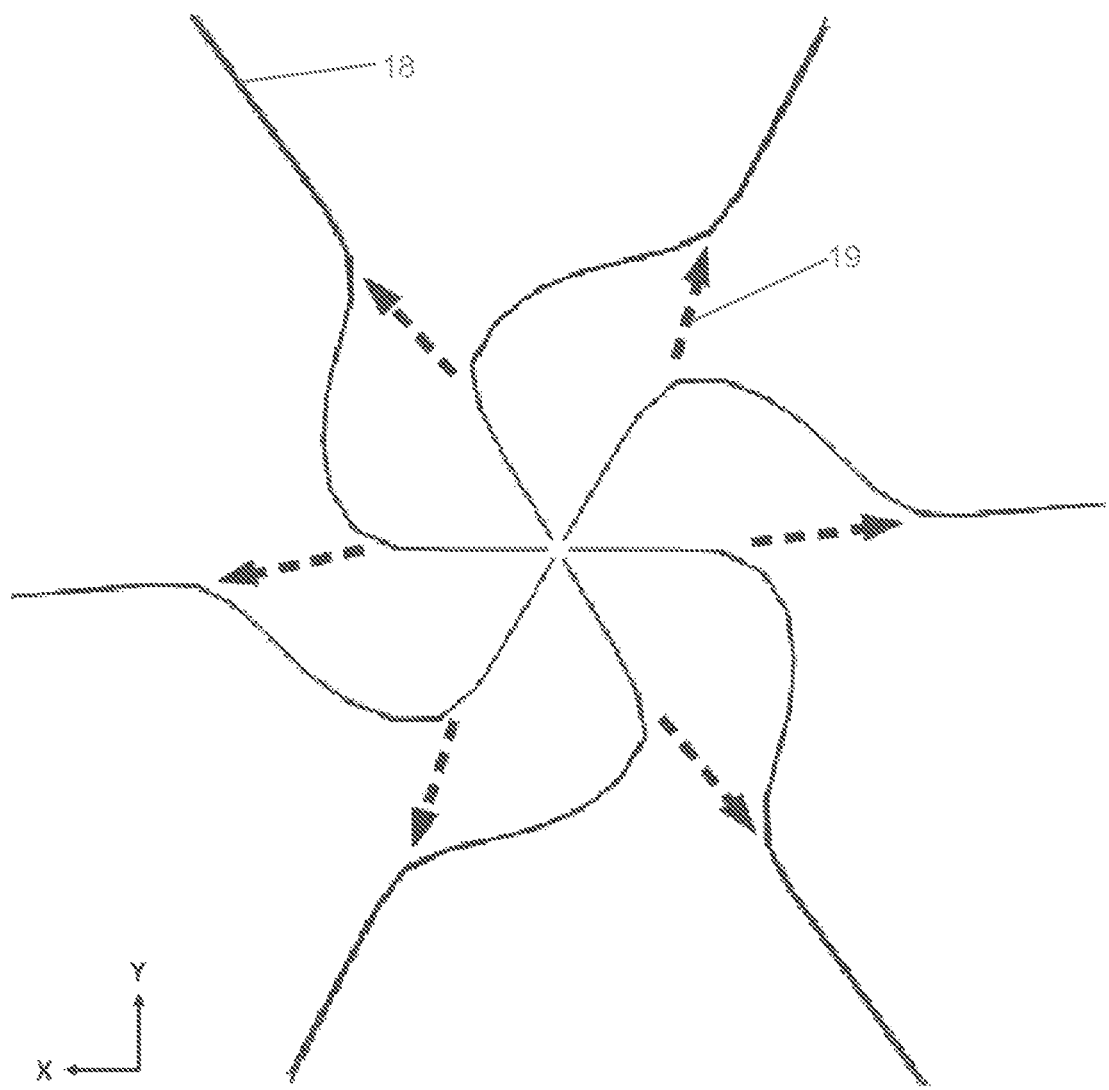
FIG. 19 depicts streamlines of perturbed radial magnetic null point field fan plane showing direction of magnetic field line re-assembly (reconnection).
Figure 20:
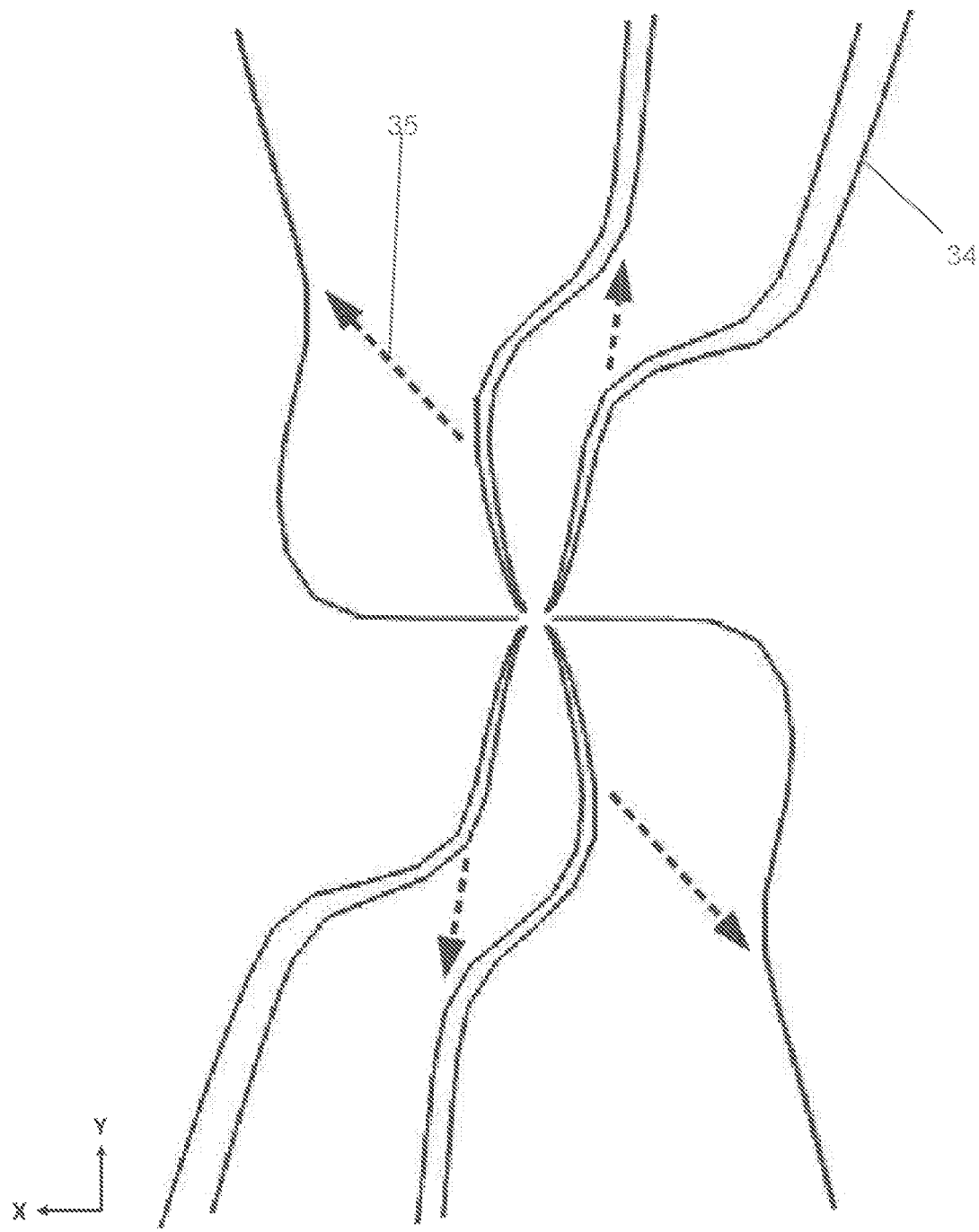
FIG. 20 depicts streamlines of a perturbed improper magnetic null point field fan plane showing direction of magnetic field line re-assembly (reconnection).
Figure 21:
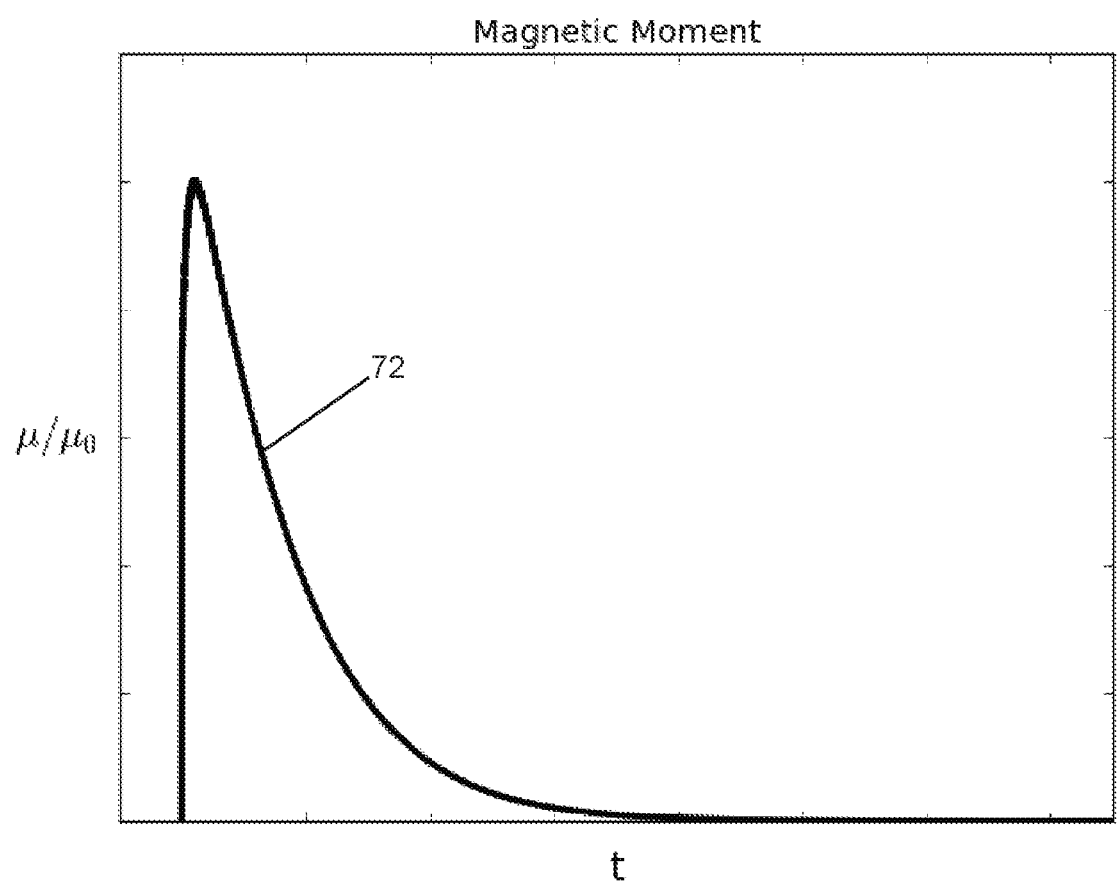
FIG. 21 depicts the time dependent magnetic moment of a test particle injected in the perturbation region, traveling through the vicinity of the magnetic null point during reconnection, and ejected out along the spine axis. Magnetic moment is scaled by the initial magnetic moment of the test particle.
Figure 22:
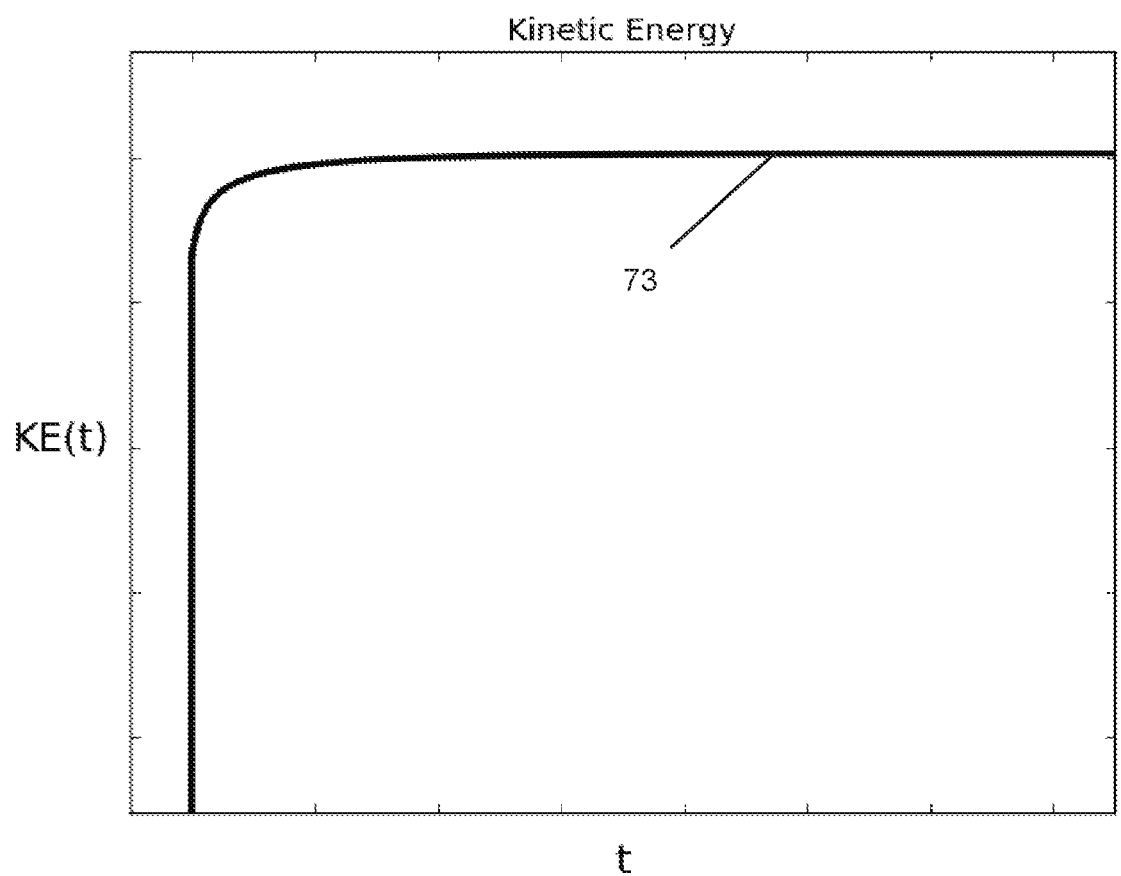
FIG. 22 depicts the time dependent kinetic energy of a test particle injected in the perturbation region, traveling through the vicinity of the magnetic null point during reconnection, and ejected out along the spine axis.
Figure 23:
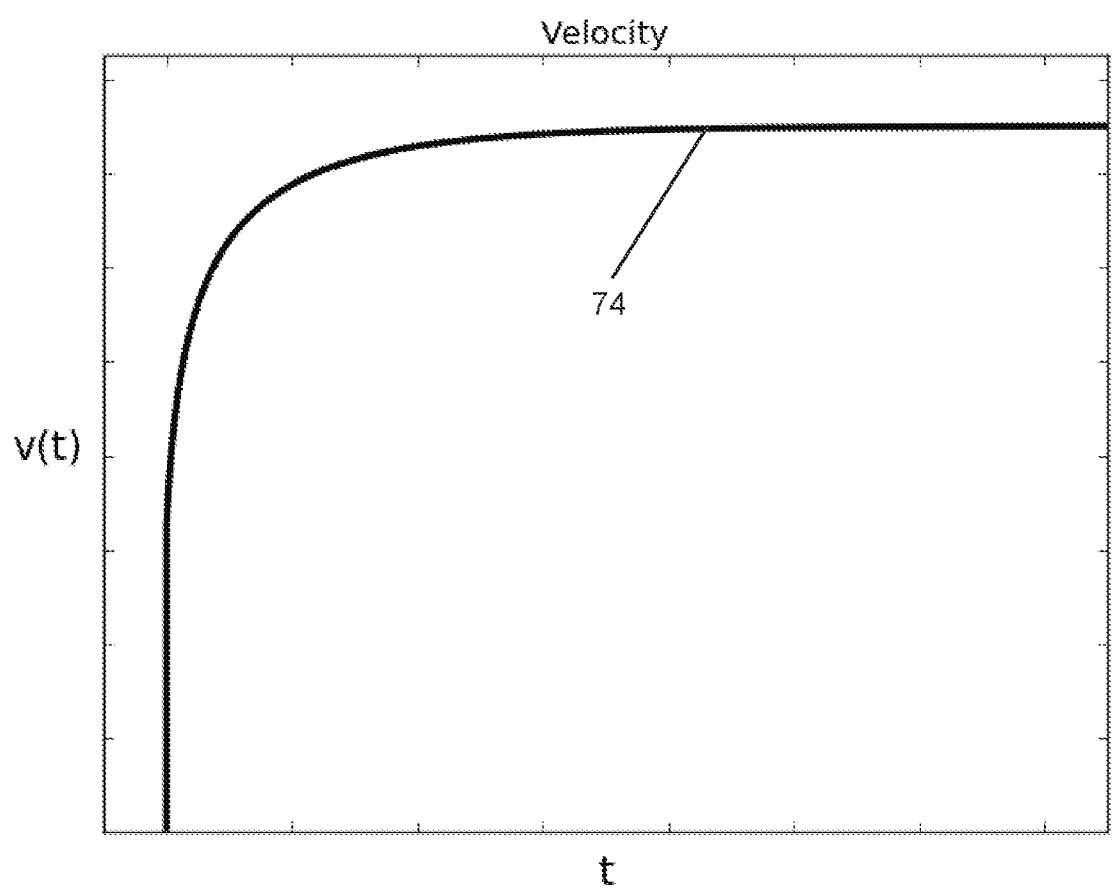
FIG. 23 depicts the time dependent velocity of a test particle injected in the perturbation region, traveling through the vicinity of the magnetic null point during reconnection, and ejected out along the spine axis.
Figure 24:
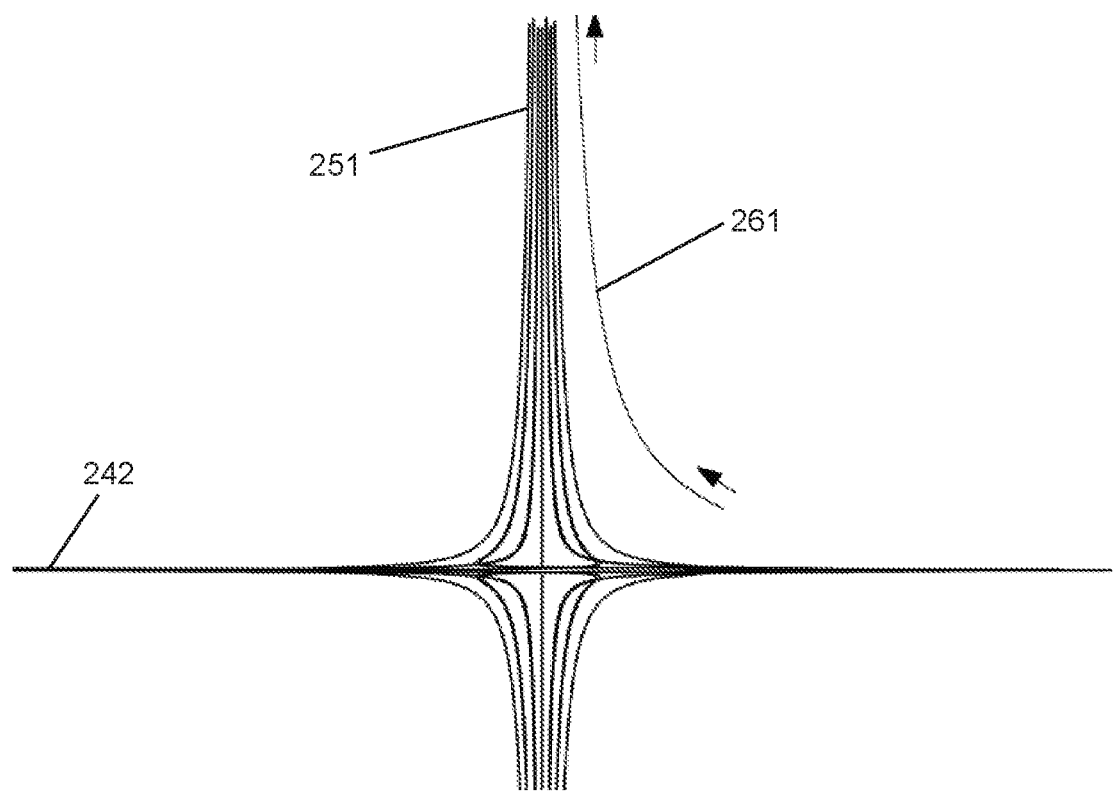
FIG. 24 depicts a side view of test particle acceleration for a deuterium ion injected in the perturbation region, with the fan plane along the line of sight. The particle is accelerated and ejected along the spine axis.
Figure 25:
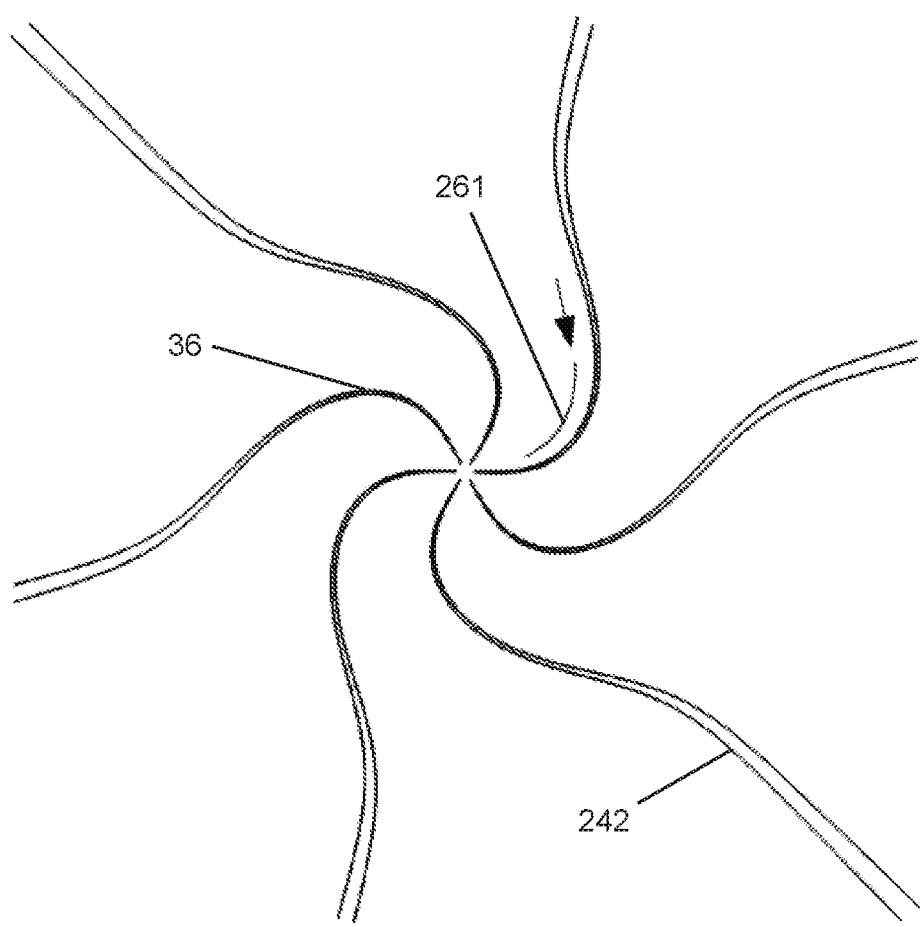
FIG. 25 depicts a top view of test particle acceleration for a deuterium ion injected in the perturbation region, with the spine axis along the line of sight. The particle is accelerated and ejected along the spine axis.

FIG. 19 depicts streamlines of perturbed radial magnetic null point field fan plane 18 showing direction of magnetic field line re-assembly (reconnection) 19. FIG. 20 depicts streamlines of a perturbed improper magnetic null point field fan plane 34 showing direction of magnetic field line re-assembly (reconnection) 35. The torsional magnetic reconnection process in the invention system occurs during this perturbation or distortion 217, 138 to the magnetic field fan plane. The PSA apparatus forms a conducting plasma sheath that induces the demagnetization of electrons and formation of current sheets during the time frame of perturbing behavior 72 FIG. 21. This breaks down of the frozen-in magnetic flux condition of MHD allows for the diffusion of the magnetic field through the plasma. For the embodiment of the invention described here, magnetic field line diffusion forces perturbed fan-plane field lines to slip through the diffusion region, thus changing their connectivities and restoring the system's potential magnetic field state, as formed by the conducting coil windings. FIG. 21 depicts the time dependent magnetic moment of a test particle injected in the perturbation region, traveling through the vicinity of the magnetic null point during reconnection, and ejected out along the spine axis. Magnetic moment is scaled by the initial magnetic moment of the test particle. The slippage of fan-plane field lines decreases the overall magnetic energy from the peak perturbed state, which is conserved within the system by a transfer to particle energy and acceleration 73, 74. See FIGS. 22, 23. FIG. 22 depicts the time dependent kinetic energy of a test particle injected in the perturbation region, traveling through the vicinity of the magnetic null point during reconnection, and ejected out along the spine axis. FIG. 23 depicts the time dependent velocity of a test particle injected in the perturbation region, traveling through the vicinity of the magnetic null point during reconnection, and ejected out along the spine axis. These reconnection-energized particles are accelerated away from the diffusion region along the open spine magnetic fields to form the focused spine-localized plasma flow 261. See FIGS. 24, 25, where fan plane 242 and spine axis 251 show plasma flow 261 in the presence of perturbation 36. However, note that similar connectivity changes 35 and plasma dynamics 72, 73, 74 will be induced in the fan plane 34 of an improper null point field and release the magnetic energy stored in this perturbation 36.

Figure 26:
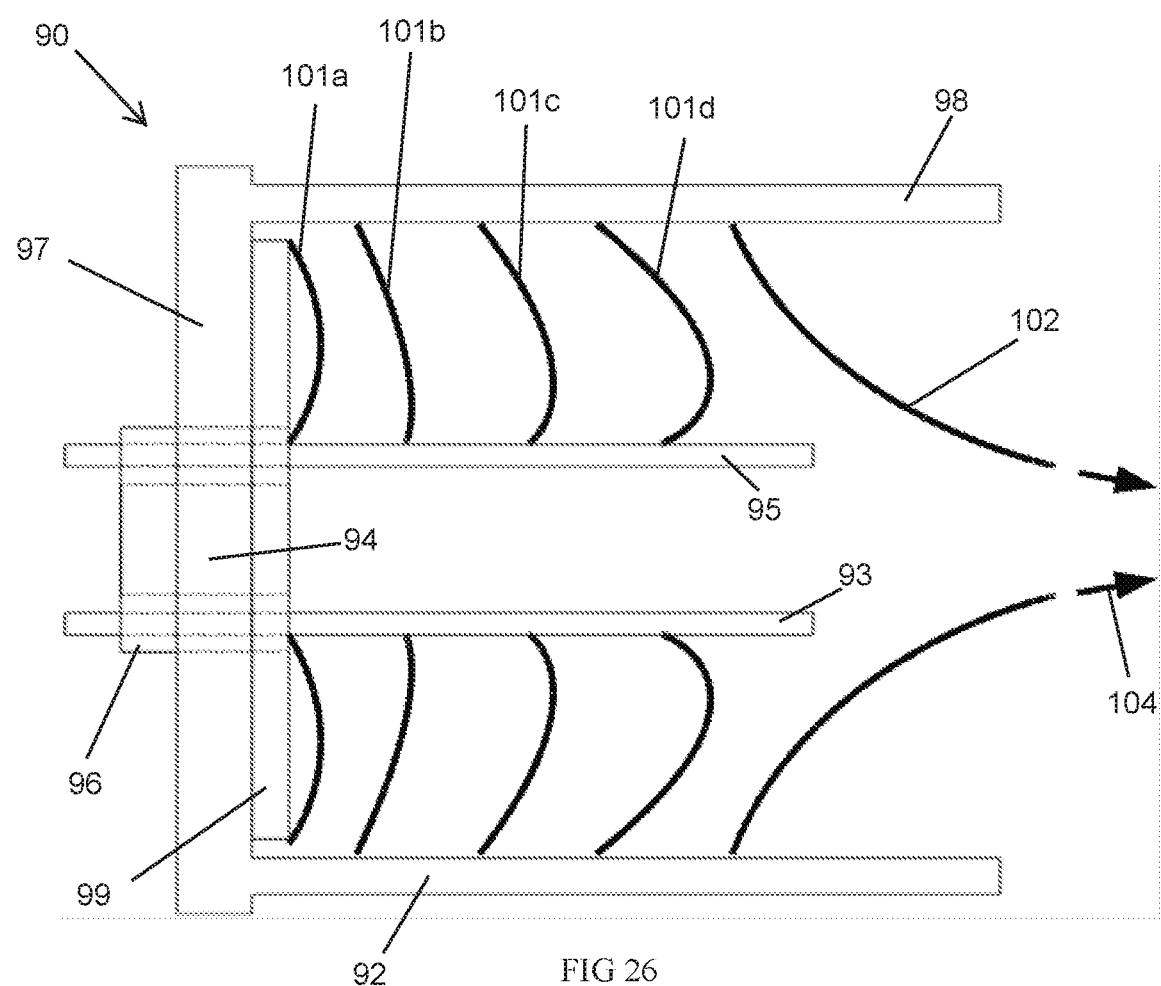
FIG. 26 depicts contours of plasma response inside a PSA of the invention.

The plasma behavior and response to the magnetic field distortions described previously are shown in FIG. 26 via plasma contours in the PSA geometry. Upon the discharge of the high voltage stored in the capacitor bank across the outer electrode cathode 92, 98, and inner electrode anodes 93, 95, a plasma 101*a* is formed along the plasma surface 99. A magnetic gradient is formed between the electrodes as the magnetic field is stronger closer to the inner electrode, causing the self-Lorentz force to be higher at the anode. The plasma sheath propagates down the inner electrode 101*b*, 101*c*, 101*d* following the plasma sheath snow plow model and forms the circular magnetic field perturbation 44, 45, 117, 118, necessary for reconnection 19, 35. The plasma sheath propagates axially at a speed of approximately 10 µs $cm^{-1}$. After reconnection occurs 19, 35, charged particles and plasma located in the magnetic field line connectivity-change region in the vicinity of distortions 138, 217 are accelerated along the spine axis field lines 136, 215, 251 and are directed in a focused fashion 104.

Figure 27:
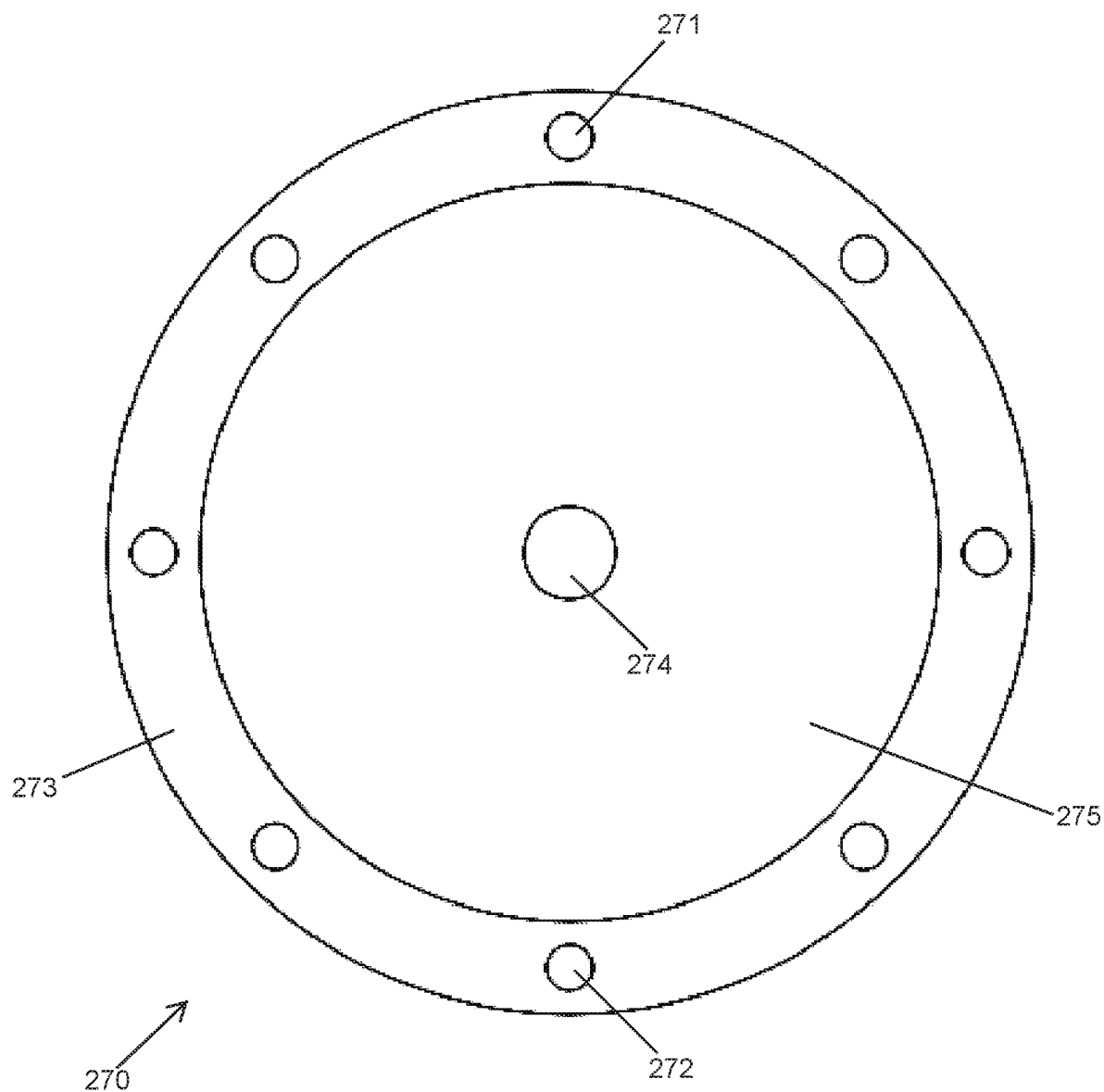
FIG. 27 depicts another PSA geometry in the radial direction.
Figure 28:
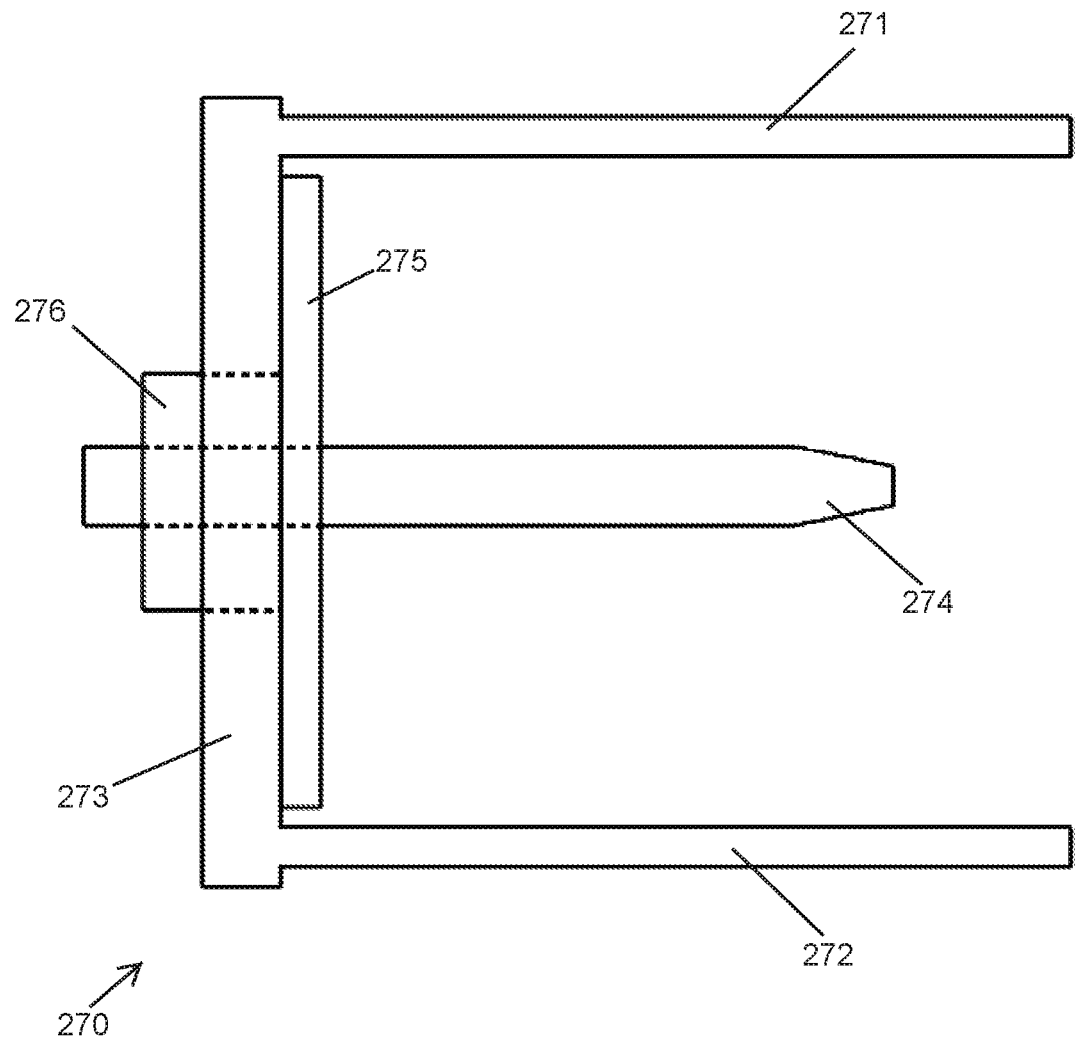
FIG. 28 depicts another PSA geometry cross-section in the axial direction.

FIG. 27 depicts dense plasma focus apparatus 270 in the radial direction. FIG. 28 depicts dense plasma focus apparatus 270 by cross-section in the axial direction. Dense plasma focus apparatus 270 has a plurality of outer electrodes 271, 272 connected to an outer electrode base 273, separated by an insulator 276 from and surrounding an inner electrode 274 and a plasma surface 275. Dense plasma focus apparatus 270 can be mounted within a vacuum environment housing parallel with a spine axis and aligning the inner electrode 274 with the center of two hemispheres, dense plasma focus apparatus 270 being adapted to generate and confine an axially propagating sheath of plasma, and to employ high-voltage discharge delivered by a capacitor bank and electrical bus to drive the axially propagating sheath of plasma into the magnetic null to induce a magnetic field perturbation that forms current sheets and forces magnetic field line diffusion through the plasma, thereby enabling torsional spine magnetic reconnection.

Figure 29:
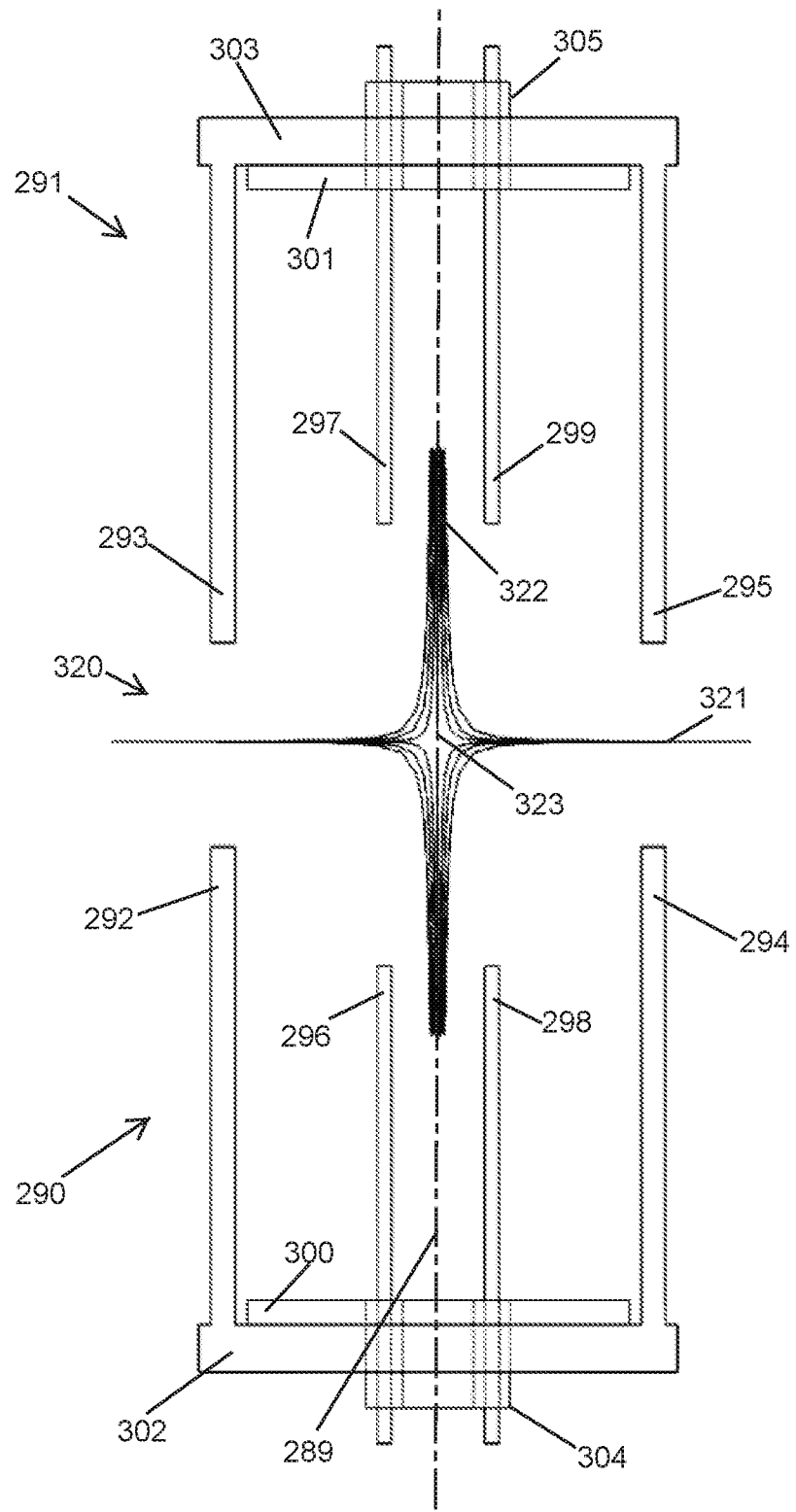
FIG. 29 depicts in cross section two PSA devices, each with a plurality of inner electrodes distributed along a longitudinal axis.

FIG. 29 depicts in cross section two PSA devices, each with a plurality of inner electrodes distributed at any arbitrary position along a longitudinal axis. First plasma sheath apparatus 290 has a plurality of outer electrodes 292, 294 connected to an outer electrode base 302, separated by an insulator 304 from and surrounding a plurality of inner electrodes 296, 298 arranged about a central axis on a plasma surface 300. Second plasma sheath apparatus 291 has a plurality of outer electrodes 293, 295 connected to an outer electrode base 303, separated by an insulator 305 from and surrounding a plurality of inner electrodes 297, 299 arranged about a central axis on a plasma surface 301. Both PSAs 290, 291 can be mounted within a vacuum environment housing such that the central axes of each plurality of inner electrodes are distributed parallel to and along the longitudinal axis 289, the plasma sheath apparatuses 290, 291 being adapted to generate and confine axially propagating sheaths of plasma, and to employ high-voltage discharges delivered by a plurality of capacitor banks and electrical buses to drive each axially propagating sheath of plasma along the spine axis 322 to induce magnetic field perturbations that form current sheets and force magnetic field line diffusion through the plasma, thereby enabling torsional fan magnetic reconnection. Also shown in FIG. 29 is radial magnetic null point field 320, having fan plane 321, spine axis 322 colinear with longitudinal axis 289, and null point 323.

Figure 30:
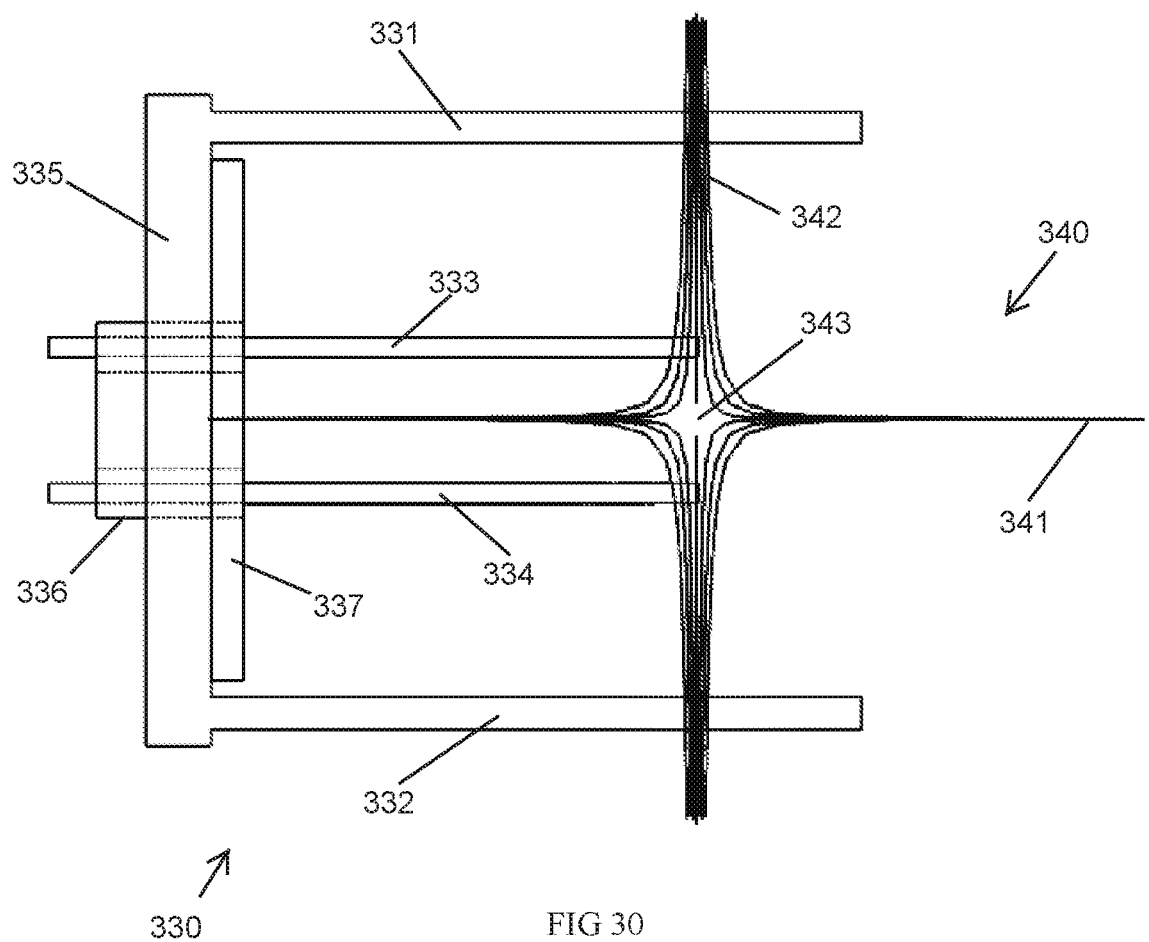
FIG. 30 depicts in cross section a PSA device mounted perpendicular to both a fan plane normal and a spine axis.

FIG. 30 depicts in cross section a PSA device mounted perpendicular to both a fan plane normal and a spine axis. Plasma sheath apparatus 330 has a plurality of outer electrodes 331, 332 connected to an outer electrode base 335, separated by an insulator 336 from and surrounding a plurality of concentrically-arranged inner electrodes 333, 334 on a plasma surface 337. PSA 330 can be mounted within a vacuum environment housing perpendicular to both the fan plane normal and the spine axis 342 and aligning the inner electrodes 333,334 with the center of the magnetic null 343 produced by a conducting coil apparatus, the plasma sheath apparatus 330 being adapted to generate and confine an axially propagating sheath of plasma, and to employ high-voltage discharge delivered by a capacitor bank and electrical bus to drive the axially propagating sheath of plasma into the magnetic null to induce a magnetic field perturbation that forms current sheets and forces magnetic field line diffusion through the plasma, thereby enabling spine-fan magnetic reconnection. FIG. 30 also shows radial magnetic null point field 340, having fan plane 341, spine axis 342, and null point 343.

The reconnection process that is initiated by the distortion of potential magnetic field lines manifests as an energy balance between the circular perturbing motions and the field line connectivity changes, or slippages, due to resistive diffusion. Previous work with robust magnetic reconnection simulations of this type note that a continually driven circular perturbation will result in the persistence of the reconnection process for the period of the controlled driving. Therefore, an optimized, temporally continuous application of these perturbations will form a quasi-steady state of continued reconnection, made possible due to pulse-power-driven PSA technology.

Magnetic reconnection is a scale invariant process that is permitted to manifest so long as certain plasma and magnetic field conditions are satisfied, and Table 1 shows plasma and magnetic field regimes in which the present invention can operate. As such, the described invention is scale invariant. That is, the geometry of the invention can be scaled up or down, as can any or all of its individual components, to meet the desired application.

REFERENCES CITED

U.S. Patent Documents

| 4,363,776 | December 1982 | Yamada et al. | ... | 06/173,555 |
| 6,921,042 | July 2005 | Goodzeit et al. | ... | 10/067,487 |
| 7,679,025 | March 2010 | Krishnan et al. | ... | 11/057,040 |

Other Publications

Mather, J., Bottoms, P., (1968) "Characteristics of the Dense Plasma Focus Discharge," Physics of Fluids, 7, 3
Buchner, J., (1999) "Three-dimensional magnetic reconnection in astrophysical plasmas—kinetic approach," Astrophys. Space Sci. 264, 25-42
Chesny, D., et al. (2017) "Toward Laboratory Torsional Spine Magnetic Reconnection," J. Plasma Physics, 83, 6
Egedal, J., et al. (2001) "Collisionless magnetic reconnection in a toroidal cusp," Phys. Plasmas 8, 1935-1943
Hosseinpour, M., (2014) "Test particle acceleration in torsional spine magnetic reconnection," Astrophys. Space Sci. 353, 379-387
Hosseinpour, M., (2014) "Comparison of test particle acceleration in torsional spine and fan reconnection regimes," Phys. Plasmas 21 (10), 102904
Parnell, C. E., et al. (1996) "The structure of three-dimensional magnetic neutral points," Phys. Plasmas 3, 759-770
Pontin, D. I., et al. (2011) "Generalised models for torsional spine and fan magnetic reconnection," Astron. Astrophys. 533, A78
Pontin, D. I., (2007) "Current amplification and magnetic reconnection at a three-dimensional null point: physical characteristics," J. Geophys. Res. 112, 3103
Yamada, M., et al. (1997) "Study of driven magnetic reconnection in a laboratory plasma," Phys. Plasmas 4, 1936-1944

EMBODIMENTS

Embodiment 1

An apparatus for confining plasma and enabling torsional spine magnetic reconnection comprising:
a vacuum environment housing;
a conducting coil apparatus, comprising two hemispheres each adapted to carry oppositely flowing current, disposed within said vacuum environment housing and symmetrically displaced with respect to each other, further adapted to carry a plurality of electric currents for rapidly generating and maintaining a fan-spine magnetic field topology characterized by a spine axis normal to and intersecting a two-dimensional fan plane at a magnetic null, the two hemispheres having a longitudinal axis colinear with the spine axis, and a center co-located with the magnetic null;
a plasma sheath apparatus having a plurality of outer electrodes connected to an outer electrode base, separated by an insulator from and surrounding a plurality of concentrically-arranged inner electrodes and a plasma surface, mounted within the vacuum environment housing parallel with the spine axis and aligning the inner electrodes with the center of the two hemispheres, the plasma sheath apparatus being adapted to employ a high-voltage discharge delivered by a capacitor bank and electrical bus to generate, confine, and drive an axially propagating sheath of plasma into the magnetic null to induce an azimuthal magnetic field perturbation that forms current sheets and forces magnetic field line diffusion through the plasma, thereby enabling torsional spine magnetic reconnection.

Embodiment 2

An apparatus for confining plasma and enabling torsional spine magnetic reconnection comprising:
a vacuum environment housing;
a conducting coil apparatus, comprised of two hemispheres each adapted to carry oppositely flowing current, disposed within said vacuum environment housing and symmetrically displaced with respect to each other, further adapted to carry a plurality of electric currents for rapidly generating and maintaining a fan-spine magnetic field topology characterized by a spine axis normal to and intersecting a two-dimensional fan plane at a magnetic null, the two hemispheres having a longitudinal axis colinear with the spine axis, and a center co-located with the magnetic null;
a dense plasma focus apparatus having a plurality of outer electrodes connected to an outer electrode base, separated by an insulator from and surrounding an inner electrode and a plasma surface, mounted within the vacuum environment housing parallel with the spine axis and aligning the inner electrode with the center of the two hemispheres, the dense plasma focus apparatus being adapted to employ high-voltage discharge delivered by a capacitor bank and electrical bus to generate, confine, and drive an axially propagating sheath of plasma into the magnetic null to induce a magnetic field perturbation that forms current sheets and forces magnetic field line diffusion through the plasma, thereby enabling torsional spine magnetic reconnection.

Embodiment 3

An apparatus for confining plasma and enabling torsional fan magnetic reconnection comprising:
  a vacuum environment housing;
  a conducting coil apparatus, comprised of two hemispheres each adapted to carry oppositely flowing current, disposed within said vacuum environment housing and symmetrically displaced with respect to each other, further adapted to carry a plurality of electric currents for rapidly generating and maintaining a fan-spine magnetic field topology characterized by a spine axis normal to and intersecting a two-dimensional fan plane at a magnetic null, the two hemispheres having a longitudinal axis colinear with the spine axis, and a center co-located with the magnetic null;
  a plurality of plasma sheath apparatuses each having a plurality of outer electrodes connected to an outer electrode base, separated by an insulator from and surrounding a plurality of inner electrodes arranged about a central axis on a plasma surface, mounted within the vacuum environment housing such that the central axis of each plurality of inner electrodes is distributed parallel to and along the longitudinal axis, the plasma sheath apparatuses being adapted to employ high-voltage discharges delivered by a plurality of capacitor banks and electrical buses to generate, confine, and drive several axially propagating sheaths of plasma along the spine axis to induce magnetic field perturbations that form current sheets and force magnetic field line diffusion through the plasma, thereby enabling torsional fan magnetic reconnection.

Embodiment 4

An apparatus for confining plasma and enabling torsional fan magnetic reconnection comprising:
  a vacuum environment housing;
  a conducting coil apparatus, comprised of two hemispheres each adapted to carry oppositely flowing current, disposed within said vacuum environment housing and symmetrically displaced with respect to each other, further adapted to carry a plurality of electric currents for rapidly generating and maintaining a fan-spine magnetic field topology characterized by a spine axis normal to and intersecting a two-dimensional fan plane at a magnetic null, the two hemispheres having a longitudinal axis colinear with the spine axis, and a center co-located with the magnetic null;
  a plurality of dense plasma focus apparatuses each having a plurality of outer electrodes connected to an outer electrode base, separated by an insulator from and surrounding an inner electrode and a plasma surface, mounted within the vacuum environment housing such that each dense plasma focus apparatus' inner electrode is distributed along the longitudinal axis, the dense plasma focus apparatuses being adapted to employ high-voltage discharges delivered by a plurality of capacitor banks and electrical buses to generate, confine, and drive several axially propagating sheaths of plasma along the spine axis to induce a magnetic field perturbation that forms current sheets and forces magnetic field line diffusion through the plasma, thereby enabling torsional fan magnetic reconnection.

Embodiment 5

An apparatus for confining plasma and enabling spine-fan magnetic reconnection comprising:
  a vacuum environment housing;
  a conducting coil apparatus, comprised of two hemispheres each adapted to carry oppositely flowing current, disposed within said vacuum environment housing and symmetrically displaced with respect to each other, further adapted to carry a plurality of electric currents for rapidly generating and maintaining a fan-spine magnetic field topology characterized by a spine axis normal to and intersecting a two-dimensional fan plane at a magnetic null, the two hemispheres having a longitudinal axis colinear with the spine axis, and a center co-located with the magnetic null;
  a plasma sheath apparatus having a plurality of outer electrodes connected to an outer electrode base, separated by an insulator from and surrounding a plurality of concentrically-arranged inner electrodes and a plasma surface, mounted within the vacuum environment housing perpendicular to both the fan plane normal and the spine axis and aligning the inner electrodes with the center of the magnetic null produced by the conducting coil apparatus, the plasma sheath apparatus being adapted to employ high-voltage discharge delivered by a capacitor bank and electrical bus to generate, confine, and drive an axially propagating sheath of plasma into the magnetic null to induce a magnetic field perturbation that forms current sheets and forces magnetic field line diffusion through the plasma, thereby enabling spine-fan magnetic reconnection.

Embodiment 6

An apparatus for confining plasma and enabling spine-fan magnetic reconnection comprising:
  a vacuum environment housing;
  a conducting coil apparatus, comprised of two hemispheres each adapted to carry oppositely flowing current, disposed within said vacuum environment housing and symmetrically displaced with respect to each other, further adapted to carry a plurality of electric currents for rapidly generating and maintaining a fan-spine magnetic field topology characterized by a spine axis normal to and intersecting a two-dimensional fan plane at a magnetic null, the two hemispheres having a longitudinal axis colinear with the spine axis, and a center co-located with the magnetic null;
  a dense plasma focus apparatus having a plurality of outer electrodes connected to an outer electrode base, separated by an insulator from and surrounding an inner electrode and a plasma surface, mounted within the vacuum environment housing perpendicular to both the fan plane normal and the spine axis and aligning the inner electrode with the center of the magnetic null produced by the conducting coil apparatus, the dense plasma sheath apparatus being adapted to employ a high-voltage discharge delivered by a capacitor bank and electrical bus to generate, confine, and drive an axially propagating sheath of plasma into the magnetic null to induce a magnetic field perturbation that forms current sheets and forces magnetic field line diffusion through the plasma, thereby enabling spine-fan magnetic reconnection.

Embodiment 7

The apparatus according to any one of embodiments 1 through 6, wherein the vacuum environment housing is closed.

Embodiment 8

The apparatus according to any one of embodiments 1 through 6, wherein the vacuum environment housing is open.

Embodiment 9

The apparatus of any one of embodiments 1 through 8, wherein said conducting coil apparatus comprises at least one conducting metal.

Embodiment 10

The apparatus of embodiment 9, wherein the at least one conducting metal comprises copper.

Embodiment 11

The apparatus of any one of embodiments 1 through 10, further comprising at least one low temperature superconducting material, at least one high temperature superconducting material, or a combination thereof.

Embodiment 12

The apparatus of any one of embodiments 1 through 11, wherein each hemisphere of said conducting coil apparatus is adapted to be energized in series.

Embodiment 13

The apparatus of any one of embodiments 1 through 11, wherein each hemisphere of said conducting coil apparatus is adapted to be energized in parallel.

Embodiment 14

The apparatus of any one of embodiments 1 through 13, wherein the insulator comprises a hole proximal to the inner electrode or plurality of concentrically-arranged inner electrodes.

Embodiment 15

The apparatus of any one of embodiments 1 through 14, wherein the outer electrode base further comprises at least one conducting metal.

Embodiment 16

The apparatus of any one of embodiments 1 through 15, wherein the plurality of outer electrodes comprises at least one conducting metal.

Embodiment 17

The apparatus of any one of embodiments 1 through 16, wherein the plurality of concentrically-arranged inner electrodes or the inner electrode comprises at least one conducting metal.

Embodiment 18

The apparatus of any one of embodiments 15 through 17, wherein the at least one conducting metal comprises copper.

Embodiment 19

The apparatus of any one of embodiments 1 through 6, wherein the insulator comprises an insulating material as a sleeve in which the plurality of concentrically-arranged inner electrodes or the inner electrode is mounted.

Embodiment 20

The apparatus of any one of embodiments 1 through 19, wherein the plasma surface comprises a non-conducting material chosen from ceramic and glass.

Embodiment 21

The apparatus of any one of embodiments 1 through 20, wherein the plasma surface is a cylinder mounted coaxially to the plurality of concentrically-arranged inner electrodes or the inner electrode.

Embodiment 22

The apparatus of any one of embodiments 1 through 21, wherein said capacitor bank is adapted to provide a pulsed-power discharge.

Embodiment 23

The apparatus of embodiment 22, wherein the pulsed-power discharge has a frequency in the range of 1-100 Hz.

Embodiment 24

The apparatus of any one of embodiments 1 through 23, further comprising a gas injection system adapted to feed gas to said vacuum environment housing via an insulated pipe.

Embodiment 25

The apparatuses of any one of embodiments 1 through 7, further comprising a gas injection system feeding gas to the vacuum environment housing via an insulated pipe and valve through the outer electrode base between the plurality of outer electrodes and the plurality of concentrically-arranged inner electrodes or the inner electrode.

Embodiment 26

The apparatus of any one of embodiments 1 through 6 and 8, further comprising a gas injection system feeding gas to the vacuum environment housing via an insulated pipe and feeding through the outer electrode base between the plurality of outer electrodes and the plurality of concentrically-arranged inner electrodes or the inner electrode.

Embodiment 27

The apparatus of any one of embodiments 1 and 2, wherein the magnetic null resides at an arbitrary position with respect to the axial direction of said plurality of concentrically-arranged inner electrodes or the inner electrode.

Embodiment 28

The apparatus of embodiment 1, wherein the plasma sheath apparatus is adapted to perturb the fan-spine magnetic field topology with a plasma sheath having a circular magnetic field profile.

Embodiment 29

The apparatus of embodiment 1, wherein the axially propagating sheath of plasma has a circular magnetic field profile.

Embodiment 30

The apparatus of embodiment 2, wherein the dense plasma focus apparatus is adapted to perturb the fan-spine magnetic field topology with a plasma sheath having a circular magnetic field profile.

Embodiment 31

The apparatus of embodiment 2, wherein the axially propagating sheath of plasma has a circular magnetic field profile.

Embodiment 32

The apparatus according to any one of embodiments 1 and 2, wherein the apparatus confines plasma.

Embodiment 33

The apparatus of embodiment 3, wherein the central axes of said plurality of plasma sheath apparatuses are colinear to the longitudinal axis, and wherein the magnetic null resides at an arbitrary position with respect to the central axes of the plurality of concentrically-arranged inner electrodes.

Embodiment 34

The apparatus of embodiment 4, wherein the magnetic null resides at an arbitrary position with respect to the longitudinal axis.

Embodiment 35

The apparatus of embodiment 3, where each plasma sheath apparatus in the plurality of plasma sheath apparatuses is adapted to perturb the fan-spine magnetic field by further comprising a plasma sheath with a circular magnetic field profile.

Embodiment 36

The apparatus of embodiment 3, wherein each of the axially propagating sheaths of plasma has a circular magnetic field profile.

Embodiment 37

The apparatus of embodiment 4, wherein each dense plasma focus apparatus in the plurality of dense plasma focus apparatuses is adapted to perturb the fan-spine magnetic field topology with a plasma sheath having a circular magnetic field profile.

Embodiment 38

The apparatus of embodiment 4, wherein each of the axially propagating sheaths of plasma has a circular magnetic field profile.

Embodiment 39

The apparatus according to any one of embodiments 3 and 4, wherein the apparatus confines plasma.

Embodiment 40

The apparatus of embodiment 5, wherein the magnetic null resides at an arbitrary position with respect to the plasma sheath apparatus' plurality of inner electrodes.

Embodiment 41

The apparatus of embodiment 6, wherein the magnetic null resides at an arbitrary position with respect to the dense plasma focus apparatus' inner electrode.

Embodiment 42

The apparatus according to any one of embodiments 5 and 6, where the apparatus confines plasma.

Embodiment 43

The apparatus of embodiment 5, wherein the plasma sheath apparatus is adapted to perturb the fan-spine magnetic field topology with a plasma sheath having a circular magnetic field profile.

Embodiment 44

The apparatus of embodiment 5, wherein the axially propagating sheath of plasma has a circular magnetic field profile.

Embodiment 45

The apparatus of embodiment 6, wherein the dense plasma focus apparatus is adapted to perturb the fan-spine magnetic field topology with a plasma sheath having a circular magnetic field profile.

Embodiment 46

The apparatus of embodiment 6, wherein the axially propagating sheath of plasma has a circular magnetic field profile.

Embodiment 47

The apparatus of any one of embodiments 1 through 6, adapted to generate a plasma beam to interact with a material by performing one or more of:
    welding the material,
    fusing the material,
    drilling the material,
    curing the material,
    cutting the material, melting the material,
evaporating the material,
treating the material,
sterilizing the material,
calibrating the material,
developing the material,
heating the material, and
irradiating the material.

Embodiment 48

The apparatus of any one of embodiments 1 through 6, adapted to generate a plasma beam to provide thrust to a craft traversing a distance.

Embodiment 49

The apparatus of any one of embodiments 1 and 2, wherein the torsional spine magnetic reconnection is adapted to allow the apparatus to act as a charged particle acceleration and/or beaming device.

Embodiment 50

The apparatus of any one of embodiments 3 and 4, wherein the torsional fan magnetic reconnection, is adapted to allow the apparatus to act as a charged particle acceleration and/or beaming device.

Embodiment 51

The apparatus of any one of embodiments 5 and 6, wherein the spine-fan magnetic reconnection is adapted to allow the apparatus to act as a charged particle acceleration and/or beaming device.

While particular embodiments of the present invention have been shown and described, it will be obvious to those skilled in the art that changes and modifications may be made without departing from the invention in its broader aspects. Therefore, the aim in the appended claims is to cover all such changes and modifications as fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

We claim:

1. An apparatus for confining plasma and enabling torsional magnetic reconnection comprising:
    a vacuum environment housing;
    a conducting coil apparatus, comprising two hemispheres, each adapted to carry oppositely flowing current, disposed within said vacuum environment housing and symmetrically displaced with respect to one another, further adapted to carry a plurality of electric currents for rapidly generating and maintaining a fan-spine magnetic field topology characterized by a spine axis normal to and intersecting a two-dimensional fan plane and a magnetic null, the two hemispheres having a longitudinal axis collinear with the spine axis, and a center co-located with the magnetic null;
    a plasma sheath apparatus having a plurality of outer electrodes connected to an outer electrode base, separated by an insulator from and surrounding one or more concentrically-arranged inner electrode(s) and a plasma surface, mounted within said vacuum environment housing with its cylindrical axis parallel or perpendicular to the spine axis, and aligning the inner electrode(s) with the center of the two hemispheres of the conducting coil apparatus, the plasma sheath apparatus being adapted to employ a high-voltage discharge delivered by a capacitor bank and electrical bus to generate, confine, and drive an axially propagating plasma sheath toward or away from the magnetic null to induce an azimuthal magnetic field perturbation that forms current sheets and forces magnetic field line diffusion through the plasma, thereby enabling torsional magnetic reconnection.

2. The apparatus of claim 1, wherein said vacuum environment housing is closed.

3. The apparatus of claim 1, wherein said vacuum environment housing is open.

4. The apparatus of claim 1, wherein the two hemispheres of said conducting coil apparatus are adapted to be energized in series.

5. The apparatus of claim 1, wherein the two hemispheres of said conducting coil apparatus are adapted to be energized in parallel.

6. The apparatus of claim 1, wherein said conducting coil apparatus comprises at least one conducting metal, at least one superconducting material, or a combination thereof.

7. The apparatus of claim 1, wherein said plasma sheath apparatus contains a hole proximal to the one or more concentrically-arranged inner electrode(s).

8. The apparatus of claim 1, wherein said plasma surface comprises a non-conducting material.

9. The apparatus of claim 8, wherein said non-conducting material is ceramic.

10. The apparatus of claim 8, wherein said non-conducting material is glass.

11. The apparatus of claim 1, wherein said capacitor bank is adapted to provide a pulsed-power discharge.

12. The apparatus of claim 1, further comprising a gas injection system adapted to feed gas to said vacuum environment housing via an insulated pipe and valve through said outer electrode base or said insulator, and between said plurality of outer electrodes and said one or more concentrically-arranged inner electrode(s).

13. The apparatus of claim 1, wherein said plasma sheath apparatus is adapted to perturb said fan-spine magnetic field topology with a plasma sheath having a circular magnetic field profile.

14. The apparatus of claim 1, further comprising a plurality of plasma sheath apparatuses including said plasma sheath apparatus, each plasma sheath apparatus in the plurality of plasma sheath apparatuses having a central axis collinear to said longitudinal axis, and wherein said magnetic null resides at an arbitrary position with respect to said one or more concentrically-arranged inner electrode(s).

15. The apparatus of claim 1, wherein said magnetic null resides at an arbitrary position with respect to the one or more concentrically-arranged inner electrode(s).

16. The apparatus of claim 1, wherein the torsional magnetic reconnection is a torsional spine magnetic reconnection adapted to allow the apparatus to act as a charged particle acceleration and/or beaming device.

17. The apparatus of claim 1, wherein the torsional magnetic reconnection is a torsional fan magnetic reconnection adapted to allow the apparatus to act as a charged particle acceleration and/or beaming device.

18. The apparatus of claim 1, wherein the torsional magnetic reconnection is a spine-fan magnetic reconnection adapted to allow the apparatus to act as a charged particle acceleration and/or beaming device.

19. The apparatus of claim 1, adapted to generate a plasma beam to interact with a material by performing one or more of:
   welding the material,
   fusing the material,
   drilling the material,
   curing the material,
   cutting the material,
   melting the material,
   evaporating the material,
   treating the material,
   sterilizing the material,
   calibrating the material,
   developing the material,
   heating the material, and
   irradiating the material.

20. The apparatus of claim 1, adapted to generate a plasma beam to provide thrust to a craft traversing a distance.

21. The apparatus of claim 1, adapted to generate and collide charged particles and/or plasma.

* * * * *